(12) United States Patent
Endo

(10) Patent No.: US 9,040,980 B2
(45) Date of Patent: May 26, 2015

(54) TRANSISTOR WITH AN OXIDE SEMICONDUCTOR LAYER

(75) Inventor: Masami Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 489 days.

(21) Appl. No.: 13/046,931

(22) Filed: Mar. 14, 2011

(65) Prior Publication Data

US 2011/0233555 A1 Sep. 29, 2011

(30) Foreign Application Priority Data

Mar. 26, 2010 (JP) ................. 2010-073106

(51) Int. Cl.
*H01L 29/10* (2006.01)
*H01L 29/786* (2006.01)
*H01L 29/417* (2006.01)
*H01L 29/423* (2006.01)

(52) U.S. Cl.
CPC ...... *H01L 29/7869* (2013.01); *H01L 29/41733* (2013.01); *H01L 29/42384* (2013.01); *H01L 29/78642* (2013.01)

(58) Field of Classification Search
USPC .............................. 257/43, E29.243
See application file for complete search history.

(56) References Cited

U.S. PATENT DOCUMENTS

| | | | |
|---|---|---|---|
| 4,882,295 A | 11/1989 | Czubatyj et al. | |
| 5,449,941 A | 9/1995 | Yamazaki et al. | |
| 5,629,222 A | 5/1997 | Yamazaki et al. | |
| 5,731,856 A | 3/1998 | Kim et al. | |
| 5,744,864 A | 4/1998 | Cillessen et al. | |
| 5,888,868 A | 3/1999 | Yamazaki et al. | |
| 6,198,125 B1 | 3/2001 | Yamazaki et al. | |
| 6,294,274 B1 | 9/2001 | Kawazoe et al. | |
| 6,448,135 B1 | 9/2002 | Yamazaki et al. | |
| 6,563,174 B2 | 5/2003 | Kawasaki et al. | |
| 6,727,522 B1 | 4/2004 | Kawasaki et al. | |
| 6,734,492 B2 | 5/2004 | Yamazaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| | | |
|---|---|---|
| CN | 86105609 A | 4/1987 |
| CN | 1941299 A | 4/2007 |

(Continued)

OTHER PUBLICATIONS

International Search Report, PCT Application No. PCT/JP2011/055000, dated May 31, 2011, 3 pages.

(Continued)

*Primary Examiner* — Hsin-Yi Hsieh
(74) *Attorney, Agent, or Firm* — Fish & Richardson P.C.

(57) ABSTRACT

It is an object to provide a semiconductor device for high power application which has good properties. A means for solving the above-described problem is to form a transistor described below. The transistor includes a source electrode layer; an oxide semiconductor layer in contact with the source electrode layer; a drain electrode layer in contact with the oxide semiconductor layer; a gate electrode layer part of which overlaps with the source electrode layer, the drain electrode layer, and the oxide semiconductor layer; and a gate insulating layer in contact with an entire surface of the gate electrode layer.

13 Claims, 14 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,429,823 B2 | 9/2008 | Yamamoto et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,811,852 B2 | 10/2010 | Yamamoto et al. |
| 7,863,611 B2 | 1/2011 | Abe et al. |
| 7,910,490 B2 | 3/2011 | Akimoto et al. |
| 7,932,521 B2 | 4/2011 | Akimoto et al. |
| 8,203,146 B2 | 6/2012 | Abe et al. |
| 8,378,415 B2 | 2/2013 | Higashino |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1* | 2/2009 | Iwasaki .......................... 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0101337 A1 | 5/2011 | Yamazaki |
| 2011/0101356 A1 | 5/2011 | Yamazaki |
| 2011/0104851 A1 | 5/2011 | Akimoto et al. |
| 2011/0117697 A1 | 5/2011 | Akimoto et al. |
| 2011/0121284 A1 | 5/2011 | Yamazaki et al. |
| 2011/0121288 A1 | 5/2011 | Yamazaki et al. |
| 2011/0121290 A1 | 5/2011 | Akimoto et al. |
| 2011/0127522 A1 | 6/2011 | Yamazaki |
| 2011/0127526 A1 | 6/2011 | Kawae et al. |
| 2013/0140628 A1 | 6/2013 | Higashino |

FOREIGN PATENT DOCUMENTS

| | | |
|---|---|---|
| CN | 101488459 A | 7/2009 |
| EP | 0 212 328 A1 | 3/1987 |
| EP | 1 737 044 A1 | 12/2006 |
| EP | 1 770 788 A2 | 4/2007 |
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| EP | 2 226 847 A2 | 9/2010 |
| JP | 60-198861 A | 10/1985 |
| JP | 62-026866 A | 2/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-189466 A | 7/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-041127 A | 2/2006 |
| JP | 2006-165532 A | 6/2006 |
| JP | 2007-096055 A | 4/2007 |
| JP | 2007-123861 A | 5/2007 |
| JP | 2007-266298 A | 10/2007 |

(56) References Cited

FOREIGN PATENT DOCUMENTS

| | | |
|---|---|---|
| JP | 2008-300546 A | 12/2008 |
| JP | 2008300546 A | 12/2008 |
| JP | 2009-038201 A | 2/2009 |
| JP | 2009-260378 A | 11/2009 |
| JP | 2010-027808 A | 2/2010 |
| KR | 1995-0001949 B | 3/1995 |
| WO | 2004/114391 A1 | 12/2004 |

OTHER PUBLICATIONS

Written Opinion, PCT Application No. PCT/JP2011/055000, dated May 31, 2011, 5 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabalized Liquid Crystal Blue Phases," Nature Materials, Sep. 1, 2002, vol. 1, pp. 64-68.

Kim, S et al., "High Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3 and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a $Zn4s$ conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Chinese Office Action (Application No. 201180015537.X) Dated Nov. 17, 2014.

\* cited by examiner

TRANSISTOR WITH AN OXIDE SEMICONDUCTOR LAYER

TECHNICAL FIELD

The technical field of the present invention relates to a semiconductor device using an oxide semiconductor.

BACKGROUND ART

In recent years, transistors which are used for many liquid crystal display devices and light-emitting display devices typified by flat panel displays have included a silicon semiconductor such as amorphous silicon or polycrystalline silicon and have been formed over glass substrates.

Instead of the silicon semiconductor, a technique in which an oxide semiconductor is used for transistors has attracted attention.

Examples of the oxide semiconductor include zinc oxide which is a one-component metal oxide and an In—Ga—Zn—O-based oxide semiconductor which is a homologous compound. In addition, techniques, in which transistors are formed using these oxide semiconductors and the transistors are used for switching elements and the like of pixels in display devices, are disclosed (see Patent Document 1 and Patent Document 2).

REFERENCE

[Patent Document 1] Japanese Published Patent Application No. 2007-123861
[Patent Document 2] Japanese Published Patent Application No. 2007-96055

DISCLOSURE OF INVENTION

A bottom-gate transistor can be said as a horizontal transistor because drain current flows between a source and a drain in a horizontal direction. It is necessary to increase the size of the horizontal transistor in order that large drain current may flow. Therefore, the horizontal transistor cannot be said to be suitable for a semiconductor device for high power application such as a power device.

As a semiconductor device for high power application, a vertical transistor, in which a semiconductor layer serving as a channel region overlaps with a source electrode layer and a drain electrode layer and the direction of drain current is a thickness direction of the semiconductor layer, is said preferable. This is because the vertical transistor can be formed to be smaller (have a smaller area) than the horizontal transistor when these transistors are formed so that the same or substantially the same amount of drain current may flow.

There are a variety of structures of vertical transistors. When a gate electrode layer of a vertical transistor is formed adjacent to a side surface of the semiconductor layer, each width of a drain electrode layer and a source electrode layer of the vertical transistor is increased (the width of a channel region is increased) in order to obtain large drain current, so that an electric field applied to the semiconductor layer from the gate electrode layer formed adjacent to the side surface of the semiconductor layer might be insufficient.

Further, the semiconductor device for high power application needs to have a structure having properties such as high breakdown voltage, high conversion efficiency, or fast switching as well as a structure in which large drain current can flow.

Thus, in view of the above points, an object of one embodiment of the present invention is to provide a semiconductor device for high power application which has good properties.

According to one embodiment of the present invention, part of a gate electrode layer of a vertical transistor overlaps with parts of a source electrode layer, a drain electrode layer, and a semiconductor layer serving as a channel region. With the structure, the gate electrode layer can apply a sufficiently high electric field to the semiconductor layer serving as a channel region.

In addition, as a semiconductor material which improves the above-described properties needed for a semiconductor device for high power application, an oxide semiconductor is preferably used.

The oxide semiconductor has a band gap which is twice or more as large as that of a silicon semiconductor; therefore, the oxide semiconductor has advantages in improvement of breakdown voltage of a semiconductor device, in a decrease in power loss, and the like.

One embodiment of the present invention is a transistor including a source electrode layer; an oxide semiconductor layer in contact with the source electrode layer; a drain electrode layer in contact with the oxide semiconductor layer; a gate electrode layer part of which overlaps with the source electrode layer, the drain electrode layer, and the oxide semiconductor layer; and a gate insulating layer in contact with an entire surface of the gate electrode layer. The gate insulating layer on a bottom surface side of the gate electrode layer is in contact with the source electrode layer, and the gate insulating layer on an upper surface side of the gate electrode layer is in contact with the oxide semiconductor layer.

Another embodiment of the present invention is a transistor including a source electrode layer; an oxide semiconductor layer in contact with the source electrode layer; a drain electrode layer in contact with the oxide semiconductor layer; a gate electrode layer part of which overlaps with the source electrode layer, the drain electrode layer, and the oxide semiconductor layer; and a gate insulating layer in contact with an entire surface of the gate electrode layer. The gate insulating layer on a bottom surface side and an upper surface side of the gate electrode layer is in contact with the oxide semiconductor layer.

In the above-described transistor, there is no particular limitation on the number of gate electrode layers and gate insulating layers which are provided. Two gate electrode layers and two gate insulating layers may be provided to increase an electric field applied to the oxide semiconductor layer, and a pair of gate electrode layers which face each other with the oxide semiconductor layer interposed therebetween and a pair of gate insulating layers which face each other with the oxide semiconductor layer interposed therebetween may be formed. Alternatively, a plurality of units in each of which the pair of the gate electrode layers face each other and the pair of the gate insulating layers face each other may be provided. Further alternatively, the gate electrode layer and the gate insulating layer may be provided in circular shapes so as to surround the oxide semiconductor layer.

When the oxide semiconductor layer is formed to be thick in the above-described transistor, planarity might be lost and the oxide semiconductor layer might be separated; therefore, a conductive layer is preferably provided in the oxide semiconductor layer.

Large drain current can flow through a transistor obtained by the above-described method, and the transistor has high drain-breakdown-voltage characteristics. Thus, one embodiment of the present invention can provide a semiconductor device for high power application which has good properties.

BEST MODE FOR CARRYING OUT THE INVENTION

Figure 1A:
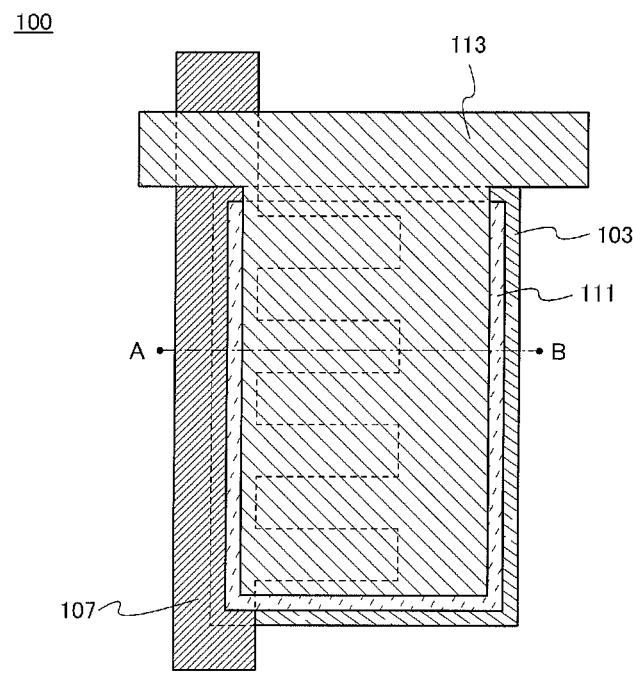
FIG. 1A is a top view of a transistor and FIG. 1B is a cross-sectional view thereof.

Embodiments of the present invention are hereinafter described in detail with reference to the accompanying drawings. Note that the present invention is not limited to the following description and it will be readily appreciated by those skilled in the art that modes and details can be modified in various ways without departing from the spirit and scope of the present invention. Therefore, the present invention should not be construed as being limited to the description in the following embodiments. Note that in structures of the present invention described hereinafter, like portions or portions having similar functions are denoted by the same reference numerals in different drawings, and description thereof is not repeated.

The size, the thickness of a layer, or a region of each structure illustrated in drawings in this specification is exaggerated for simplicity in some cases. Therefore, embodiments of the present invention are not limited to such scales.

Note that in this specification, "on-state current" is current which flows between a source and a drain when a thin film transistor is in an on state. For example, in the case of an n-channel thin film transistor, the on-state current is current which flows between a source and a drain when the gate voltage of the transistor is higher than the threshold voltage thereof. In addition, "off-state current" is current which flows between a source and a drain when a thin film transistor is in an off state. For example, in the case of an n-channel thin film transistor, the off-state current is current which flows between a source and a drain when the gate voltage of the transistor is lower than the threshold voltage thereof. Note that here, "gate voltage" refers to a potential difference between a source and a gate when the potential of the source is used as a reference potential.

Functions of a "source" and a "drain" are sometimes interchanged with each other when the direction of current flow is changed in circuit operation, for example. Therefore, the terms "source" and "drain" can be used to denote the drain and the source, respectively, in this specification.

Embodiment 1

In this embodiment, a structure of a transistor 100 will be described with reference to FIGS. 1A and 1B.

Figure 1B:
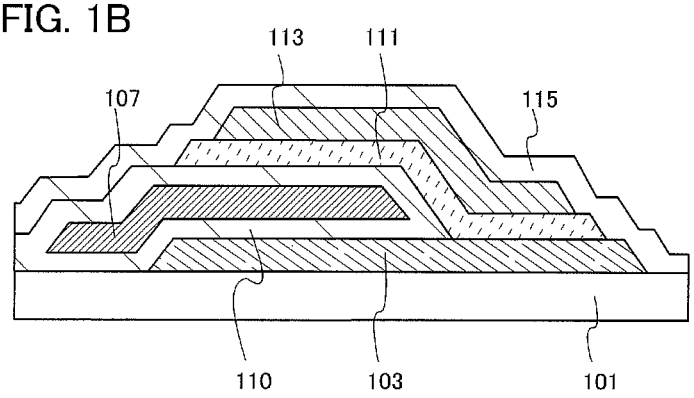

FIG. 1A is a top view of the transistor 100, and FIG. 1B corresponds to a cross-sectional view taken along dashed line A-B in FIG. 1A.

As illustrated in FIG. 1B, a source electrode layer 103 is provided over a substrate 101, and a gate insulating layer 110 and a gate electrode layer 107 are provided over the source electrode layer 103. The gate insulating layer 110 covers an upper surface and a bottom surface of the gate electrode layer 107 and is in contact with the source electrode layer 103. Further, a bottom surface of an oxide semiconductor layer 111 is in contact with part of the gate insulating layer 110 and part of the source electrode layer 103. In addition, a drain electrode layer 113 is provided over the oxide semiconductor layer 111, and a protective insulating layer 115 is provided over the outermost layer of the transistor 100.

In the transistor 100, part of the gate electrode layer 107 overlaps with the source electrode layer 103 and the drain electrode layer 113, and is covered with the oxide semiconductor layer 111 with the gate insulating layer 110 interposed therebetween.

The oxide semiconductor layer 111 of the transistor 100 is a highly-purified oxide semiconductor layer and is an oxide semiconductor layer in which defect levels are reduced.

In the transistor 100, since part of the gate electrode layer 107 is covered with the oxide semiconductor layer 111, a sufficiently high electric field can be applied to the oxide semiconductor layer 111; therefore, a channel region is formed in a wide area of the oxide semiconductor layer 111. Accordingly, large drain current can flow through the transistor 100.

Further, the thickness of the oxide semiconductor layer 111 is made large, whereby the transistor 100 can have drain-breakdown-voltage characteristics needed for a semiconductor device for high power application. Further, each of the gate electrode layer 107 and the gate insulating layer 110 preferably has a comb shape in order to apply a sufficiently high electric field to the wide area of the oxide semiconductor layer 111.

There is no particular limitation on the substrate 101 as long as the substrate 101 at least has heat resistance sufficient to withstand heat treatment to be performed later. As the substrate 101, a glass substrate of barium borosilicate glass, aluminoborosilicate glass, or the like can be used.

As a glass substrate, if the temperature of the heat treatment to be performed later is high, a glass substrate whose strain point is 730° C. or higher is preferably used. As a glass substrate, a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used instead of the glass substrate. Alternatively, crystallized glass or the like may be used.

The source electrode layer 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. Further, a semiconductor material typified by polycrystalline silicon that is doped with an impurity element such as phosphorus, an AgPdCu alloy, an Al—Nd alloy, an Al—Ni alloy or the like may also be used. The source electrode layer 103 can have a single-layer structure or a stacked structure of two or more layers. For example, a single-layer structure of an aluminum film containing silicon, a two-layer structure in which a titanium film is formed over an aluminum film, a two-layer structure in which a copper film is formed over a copper-magnesium-aluminum alloy film, a two-layer structure in which a titanium film is formed over a tungsten film, a three-layer structure in which a titanium film, an aluminum film, and a titanium film are stacked in that order, and the like can be given.

Further, the source electrode layer 103 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. A stacked structure of the above-described light-transmitting conductive material and the above-described metal element may be employed for the source electrode layer 103. Note that the thickness of the source electrode layer 103 can be determined as appropriate in consideration of adhesion to the substrate 101, resistivity of the source electrode layer 103, and the like. For example, the thickness of the source electrode layer 103 may be greater than or equal to 50 nm and less than or equal to 500 nm.

The gate insulating layer 110 can be formed with a silicon oxide film, a silicon nitride film, a silicon oxynitride film, a silicon nitride oxide film, an aluminum oxide film, an aluminum nitride film, an aluminum oxynitride film, an aluminum nitride oxide film, a tantalum oxide film, or a gallium oxide film. A portion of the gate insulating layer 110 which is in contact with the oxide semiconductor layer 111 preferably contains oxygen, and in particular, the gate insulating layer 110 is preferably formed using a silicon oxide film.

When a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added is used, gate leakage current can be reduced.

Further, the gate insulating layer 110 may have a single-layer structure or a stacked structure. When the thickness of the gate insulating layer 110 is made large, gate leakage current can be reduced. Note that the thickness of the gate insulating layer may be greater than or equal to 50 nm and less than or equal to 500 nm.

The gate electrode layer 107 which is formed on the gate insulating layer 110 so as to be covered with the gate insulating layer 110 can be formed using a material which is similar to that of the source electrode layer 103.

The oxide semiconductor layer 111 which covers part of the gate electrode layer 107 with the gate insulating layer 110 interposed therebetween and which is in contact with part of the source electrode layer 103 can be formed using a film including any of the following oxide semiconductors: a quaternary metal oxide such as an In—Sn—Ga—Zn—O-based oxide semiconductor; ternary metal oxides such as an In—Ga—Zn—O-based oxide semiconductor, an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, and an Sn—Al—Zn—O-based oxide semiconductor; binary metal oxides such as an In—Zn—O-based oxide semiconductor, an Sn—Zn—O-based oxide semiconductor, an Al—Zn—O-based oxide semiconductor, a Zn—Mg—O-based oxide semiconductor, an Sn—Mg—O-based oxide semiconductor, and an In—Mg—O-based oxide semiconductor; an In—O-based oxide semiconductor; an Sn—O-based oxide semiconductor; and a Zn—O-based oxide semiconductor.

In particular, an In—Ga—Zn—O-based oxide semiconductor has sufficiently high resistance when there is no electric field and can realize a sufficiently small off-state current. Moreover, the In—Ga—Zn—O-based oxide semiconductor has high field-effect mobility and thus is suitable for a semiconductor material used for a transistor which is one embodiment of the present invention. For example, an In—Ga—Zn—O-based oxide semiconductor means an oxide semiconductor containing indium (In), gallium (Ga), and zinc (Zn), and there is no limitation on the composition ratio thereof. For the oxide semiconductor layer, a thin film, represented by the chemical formula, $InMO_3(ZnO)_m$ (m>0) can be used. Here, M is one or more metal elements selected from Zn, Ga, Al, Mn, and Co. For example, M may be Ga, Ga and Al, Ga and Mn, Ga and Co, or the like. The drain breakdown voltage depends on the thickness of the oxide semiconductor layer; therefore, in order to increase the drain breakdown voltage, the thickness of the oxide semiconductor layer is preferably large and may correspond to the desired drain breakdown voltage. For example, the thickness of the oxide semiconductor layer 111 is greater than or equal to 30 nm and less than or equal to 1 μm, whereby throughput can be improved.

The oxide semiconductor layer can be formed by sputtering or the like using a metal oxide target. It is preferable that a metal oxide contained in the metal oxide target have a relative density (also referred as a filling rate) of 80% or higher, preferably 95% or higher, more preferably 99.9% or higher. The use of the metal oxide target having high relative density makes it possible to form the oxide semiconductor layer having a dense structure.

Here, it is preferable that the oxide semiconductor layer 111 be highly purified by sufficient removal of impurities such as hydrogen or sufficient supply of oxygen. Specifically, the concentration of hydrogen in the oxide semiconductor layer III is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$, for example. Note that the concentration of hydrogen in the oxide semiconductor layer 111 is measured by secondary ion mass spectrometry (SIMS). In this manner, the oxide semiconductor layer 111 which is highly purified by a sufficient reduction in concentration of hydrogen and in which defect levels are reduced has low carrier density due to a donor such as hydrogen. Therefore, the transistor 100 with excellent off-state current characteristics can be obtained with the use of such an oxide semiconductor layer that is highly purified.

The drain electrode layer 113 in contact with the oxide semiconductor layer 111 can be formed using a material which is similar to that of the source electrode layer 103 and the gate electrode layer 107.

The protective insulating layer 115 which is formed on and in contact with the drain electrode layer 113 can be formed using a material which is similar to that of the gate insulating layer 110.

Here, the drain-breakdown-voltage characteristics of a transistor formed using an oxide semiconductor will be described.

When the electric field in the semiconductor reaches a certain threshold value, impact ionization occurs, carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have kinetic energy that is larger than or equal to the band gap of the semiconductor. It is known that the impact ionization coefficient that shows probability of impact ionization has correlation with the band gap and that the impact ionization is unlikely to occur as the band gap is increased.

Since the band gap of the oxide semiconductor is approximately 3 eV to 3.4 eV, which is larger than the band gap of silicon, approximately 1.1 eV, the avalanche breakdown is expected to be unlikely to occur. Therefore, a transistor formed using the oxide semiconductor has high drain-breakdown-voltage characteristics, and an exponential sudden increase of on-state current is expected to be unlikely to occur when a high electric field is applied.

Next, hot-carrier degradation of a transistor formed using an oxide semiconductor will be described.

The hot-carrier degradation means deterioration of transistor characteristics, e.g., variation in the threshold voltage or gate leakage, owing to a phenomenon that electrons that are accelerated to be rapid become a fixed charge by being injected in a gate oxide film in the vicinity of a drain in a channel, or a phenomenon that electrons that are accelerated to be rapid form a trap level at the interface between the gate insulating film and the oxide semiconductor film. The factors of the hot-carrier degradation are channel-hot-electron injection (CHE injection) and drain-avalanche-hot-carrier injection (DAHC injection).

Since the band gap of silicon is narrow, electrons are likely to be generated like an avalanche owing to an avalanche breakdown, and electrons that are accelerated to be so rapid as to go over a barrier to the gate insulating film are increased in number. However, the oxide semiconductor described in this embodiment has a wide band gap; therefore, the avalanche breakdown is unlikely to occur and resistance to the hot-carrier degradation is higher than that of silicon.

As described above, the oxide semiconductor layer 111 is formed using an oxide semiconductor which has excellent drain-breakdown-voltage characteristics and excellent resistance to hot-carrier degradation; therefore, the transistor 100 which is described in this embodiment has excellent drain-breakdown-voltage characteristics and excellent resistance to hot-carrier degradation.

This embodiment can be implemented in appropriate combination with the structure described in any of the other embodiments.

Embodiment 2

In this embodiment, a transistor 200 having a structure which is partly different from the structure of the transistor 100 described in Embodiment 1 will be described with reference to FIGS. 2A and 2B.

Figure 2A:
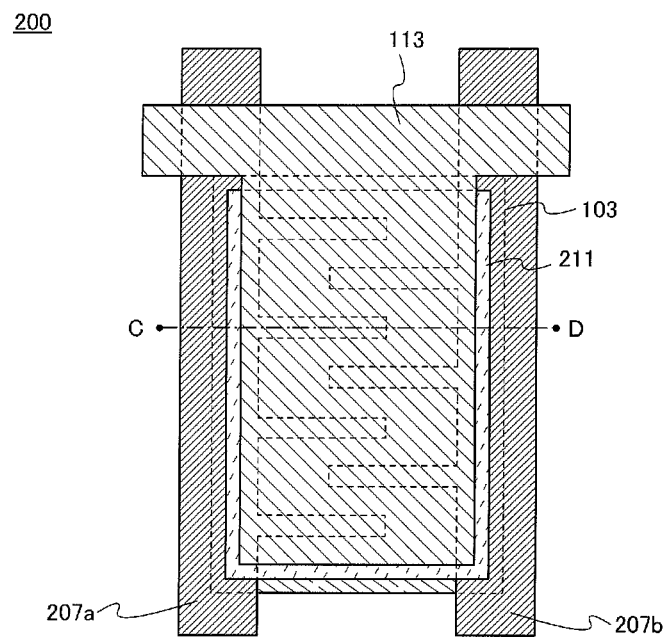
FIG. 2A is a top view of a transistor and FIG. 2B is a cross-sectional view thereof.
Figure 2B:
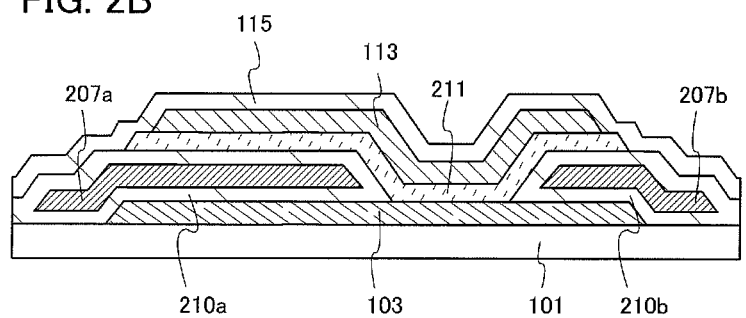

FIG. 2A is a top view of the transistor 200, and FIG. 2B corresponds to a cross-sectional view taken along dashed line C-D in FIG. 2A.

As illustrated in FIG. 2B, the source electrode layer 103 is provided over the substrate 101, and gate insulating layers 210a and 210b and gate electrode layers 207a and 207b are provided over the source electrode layer 103. The gate insulating layers 210a and 210b cover upper surfaces and bottom surfaces of the gate electrode layers 207a and 207b and are in contact with the source electrode layer 103. In addition, an oxide semiconductor layer 211 is provided so as to cover parts of the gate insulating layers 210a and 210b and to be in contact with part of the electrode layer 103. Further, the drain electrode layer 113 is provided on and in contact with the oxide semiconductor layer 211, and the protective insulating layer 115 is provided on and in contact with the drain electrode layer 113.

The transistor 200 is different from the transistor 100 of Embodiment 1 in that the gate electrode layer 207a and the gate electrode layer 207b face each other with the oxide semiconductor layer 211 interposed therebetween and the gate insulating layer 210a and the gate insulating layer 210b face each other with the oxide semiconductor layer 211 interposed therebetween, that is, a pair of the gate electrode layers and a pair of the gate insulating layers are provided with the oxide semiconductor layer 211 interposed between the gate electrode layers and between the gate insulating layers.

In the transistor 200, parts of the gate electrode layers 207a and 207b overlap with the source electrode layer 103 and the drain electrode layer 113 and are covered with the oxide semiconductor layer 211 with the gate insulating layers 210a and 210b interposed therebetween.

Further, the oxide semiconductor layer 211 of the transistor 200 is formed using the material same as that of the oxide semiconductor layer 111; therefore, the oxide semiconductor layer 211 is a highly-purified oxide semiconductor layer and is an oxide semiconductor layer in which defect levels are reduced.

In the transistor 200, at least parts of the gate electrode layers 207a and 207b are covered with the oxide semiconductor layer 211, and a sufficiently high electric field can be applied to the oxide semiconductor layer 211; therefore, a channel region is formed in a wide area of the oxide semiconductor layer 211. Thus, large drain current can flow through the transistor 200.

Further, the thickness of the oxide semiconductor layer 211 is made large, whereby the transistor 200 can have drain-breakdown-voltage characteristics needed for a semiconductor device for high power application. In addition, it is preferable that the gate electrode layers 207a and 207b and the gate insulating layers 210a and 210b each have a comb shape in order to apply a sufficiently high electric field to the wide area of the oxide semiconductor layer 211.

In addition, the oxide semiconductor layer 211 described in this embodiment is the highly purified oxide semiconductor layer; therefore, the transistor 200 can be a transistor which has excellent off-state-current characteristics.

The substrate 101, the source electrode layer 103, the gate insulating layers 210a and 210b, the gate electrode layers 207a and 207b, the oxide semiconductor layer 211, and the drain electrode layer 113 which are described in this embodiment can be formed using materials which are similar to those of Embodiment 1.

This embodiment can be implemented in appropriate combination with the structure described in any of the other embodiments.

Embodiment 3

In this embodiment, a transistor 300 having a structure which is partly different from the structure of the transistor 200 described in Embodiment 2 will be described with reference to FIGS. 3A and 3B.

Figure 3A:
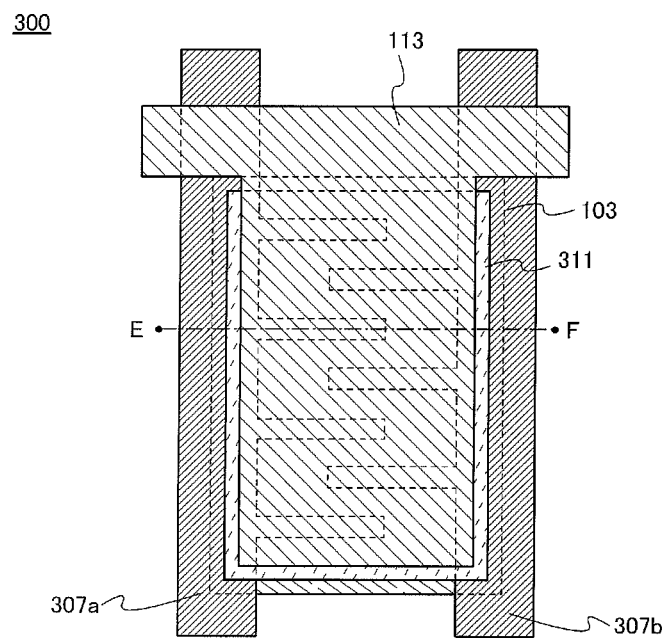
FIG. 3A is a top view of a transistor and FIG. 3B is a cross-sectional view thereof.
Figure 3B:
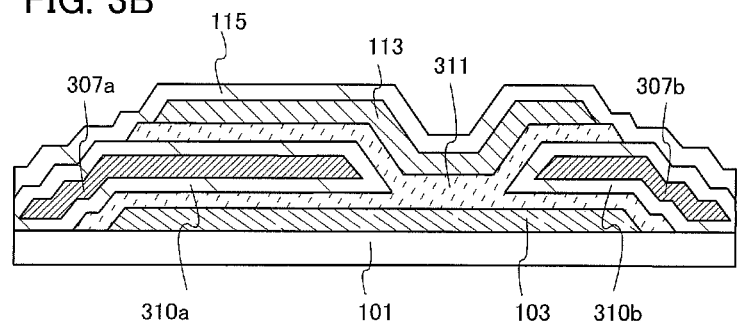

FIG. 3A is a top view of the transistor 300, and FIG. 3B corresponds to a cross-sectional view taken along dashed line E-F in FIG. 3A.

As illustrated in FIG. 3B, the source electrode layer 103 is provided over the substrate 101, and an oxide semiconductor layer 311, gate insulating layers 310a and 310b, and gate electrode layers 307a and 307b are provided over the source electrode layer 103. The gate insulating layers 310a and 310b cover upper surfaces and bottom surfaces of the gate electrode layers 307a and 307b. The oxide semiconductor layer 311 is in contact with the source electrode layer 103. Portions of the gate insulating layers 310a and 310b and the gate electrode layers 307a and 307b which overlap with the source electrode layer 103 are covered with the oxide semiconductor layer 311. Further, the drain electrode layer 113 is provided over the oxide semiconductor layer 311, and the protective insulating layer 115 is provided over the drain electrode layer 113.

The transistor 300 is formed in such a way that the gate electrode layer 307a and the gate insulating layer 310a face the gate electrode layer 307b and the gate insulating layer 310b and the oxide semiconductor layer 311 is provided between the gate electrode layer 307a and the gate electrode layer 307b and between the gate insulating layer 310a and the gate insulating layer 310b, that is, a pair of the gate electrode layers 307a and 307b are provided with the oxide semiconductor layer 311 interposed therebetween and a pair of the gate insulating layers 310a and 310b are provided with the oxide semiconductor layer 311 interposed therebetween.

In the transistor 300, the portions of the gate insulating layers 310a and 310b and the gate electrode layers 307a and 307b, which overlap with the source electrode layer 103, are covered with the oxide semiconductor layer 311.

Further, the oxide semiconductor layer 311 of the transistor 300 is formed using the material same as that of the oxide semiconductor layer 111; therefore, the oxide semiconductor layer 311 is a highly-purified oxide semiconductor layer and is an oxide semiconductor layer in which defect levels are reduced.

In the transistor 300, parts of the gate electrode layers 307a and 307b are covered with the oxide semiconductor layer 311, and a sufficiently high electric field can be applied to the oxide semiconductor layer 311; therefore, a channel region is formed in a wide area of the oxide semiconductor layer 311. Thus, large drain current can flow through the transistor 300.

Further, the thickness of the oxide semiconductor layer 311 is made large, whereby the transistor 300 can have drain-breakdown-voltage characteristics needed for a semiconductor device for high power application. In addition, it is preferable that the gate electrode layers 307a and 307b and the gate insulating layers 310a and 310b each have a comb shape in order to apply a sufficiently high electric field to the wide area of the oxide semiconductor layer 311.

In addition, the oxide semiconductor layer 311 described in this embodiment is the highly-purified oxide semiconductor layer; therefore, the transistor 300 can be a transistor which has excellent off-state-current characteristics.

The substrate 101, the source electrode layer 103, the gate insulating layers 310a and 310b, the gate electrode layers 307a and 307b, and the drain electrode layer 113 which are described in this embodiment can be formed using materials which are similar to those of Embodiment 1.

This embodiment can be implemented in appropriate combination with the structure described in any of the other embodiments.

Embodiment 4

In this embodiment, a transistor having a plurality of units in each of which a pair of gate electrode layers face each other with an oxide semiconductor layer interposed therebetween and a pair of gate insulating layers face each other with the oxide semiconductor layer interposed therebetween will be described. As an example, a transistor 400 having two units in each of which a pair of gate electrode layers face each other with an oxide semiconductor layer interposed therebetween and a pair of gate insulating layers face each other with the oxide semiconductor layer interposed therebetween will be described with reference to FIGS. 4A and 4B.

Figure 4A:
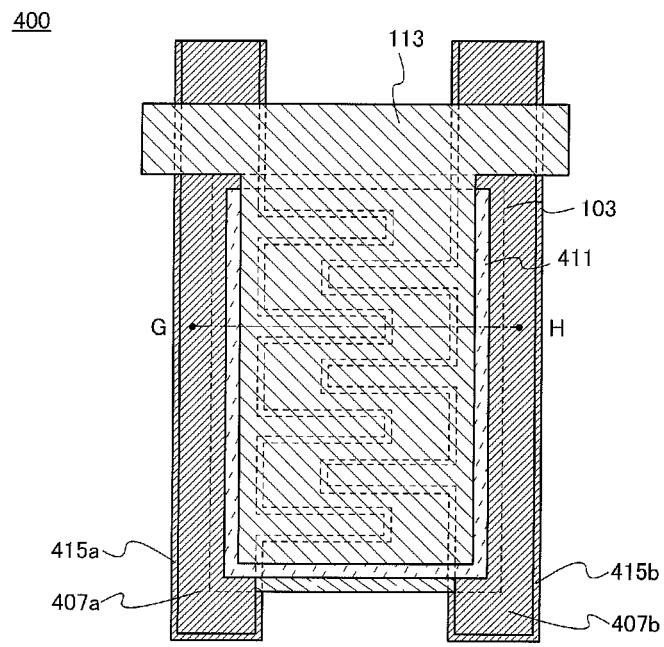
FIG. 4A is a top view of a transistor and FIG. 4B is a cross-sectional view thereof.
Figure 4B:
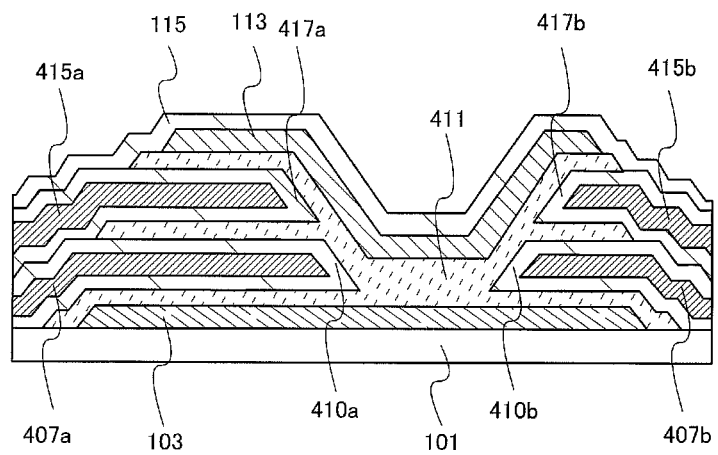

FIG. 4A is a top view of the transistor 400, and FIG. 4B corresponds to a cross-sectional view taken along dashed line G-H in FIG. 4A.

As shown in FIG. 4B and FIG. 3B, the transistor 400 corresponds to a transistor having two units in each of which a pair of the gate electrode layers 307a and 307b face each other with the oxide semiconductor layer 311 interposed therebetween and a pair of the gate insulating layers 310a and 310b face each other with the oxide semiconductor layer 311 interposed therebetween in the transistor 300 described in Embodiment 3, in an oxide semiconductor layer 411.

In the case where the thickness of the oxide semiconductor layer 311 in the transistor 300 is made large in order to obtain the drain breakdown voltage with respect to large drain current, when one unit in which a pair of the gate electrode layers 307a and 307b which face each other with the oxide semiconductor layer 311 interposed therebetween and a pair of the gate insulating layers 310a and 310b which face each other with the oxide semiconductor layer 311 interposed therebetween is used, a sufficiently high electric field cannot be applied to the oxide semiconductor layer 311, and a wide channel region cannot be formed. As a result, there is a possibility that large drain current cannot be obtained.

Thus, the transistor 400 described in this embodiment has two units in each of which a pair of the gate electrode layers face each other with the oxide semiconductor layer 411 interposed therebetween and a pair of the gate insulating layers face each other with the oxide semiconductor layer 411 interposed therebetween. Accordingly, even when the thickness of the oxide semiconductor layer 411 which is a channel region is made large, a sufficiently high electric field can be applied to the oxide semiconductor layer 411 and a wide channel region can be formed, whereby large drain current can be obtained.

In other words, in the transistor 400, the source electrode layer 103 is provided over the substrate 101, and the oxide semiconductor layer 411 is provided to be in contact with the source electrode layer 103. Further, there are portions of a pair of gate electrode layers 407a and 407b which face each other with the oxide semiconductor layer 411 interposed therebetween and a pair of gate insulating layers 410a and 410b which face each other with the oxide semiconductor layer 411 interposed therebetween and portions of a pair of gate electrode layers 415a and 415b which face each other with the oxide semiconductor layer 411 interposed therebetween and a pair of gate insulating layers 417a and 417b which face each other with the oxide semiconductor layer 411 interposed therebetween; these portions which overlap with the source electrode layer 103 are covered with the oxide semiconductor layer 411. Note that the gate insulating layers 410a and 410b cover upper surfaces and bottom surfaces of the gate electrode layers 407a and 407b. The gate insulating layers 417a and 417b cover upper surfaces and bottom surfaces of the gate electrode layers 415a and 415b. Further, the drain electrode layer 113 is provided over the oxide semiconductor layer 411, and the protective insulating layer 115 is provided over the drain electrode layer 113.

The transistor 400 has two units in each of which a pair of the gate electrode layers face each other with the oxide semiconductor layer 411 interposed therebetween and a pair of the gate insulating layers face each other with the oxide semiconductor layer 411 interposed therebetween.

In the transistor 400, the portions, which overlap with the source electrode layer 103 and the drain electrode layer 113, of the gate electrode layers 407a and 407b, the gate insulating layers 410a and 410b, the gate electrode layers 415a and 415b, and the gate insulating layers 417a and 417b are covered with the oxide semiconductor layer 411.

Further, the oxide semiconductor layer 411 of the transistor 400 is formed using the material same as that of the oxide semiconductor layer 111; therefore, the oxide semiconductor layer 411 is a highly-purified oxide semiconductor layer and is an oxide semiconductor layer in which defect levels are reduced.

In the transistor 400, parts of the gate electrode layers 407a, 407b, 415a, and 415b are covered with the oxide semiconductor layer 411, and a sufficiently high electric field can be applied to the oxide semiconductor layer 411; therefore, a channel region is formed in a wide area of the oxide semiconductor layer 411. Thus, large drain current can flow through the transistor 400.

Further, the thickness of the oxide semiconductor layer 411 is made large, whereby the transistor 400 can have drain-breakdown-voltage characteristics needed for a semiconductor device for high power application. In addition, it is preferable that the gate electrode layers 407a and 407b, the gate insulating layers 410a and 410b, the gate electrode layers 415a and 415b, and the gate insulating layers 417a and 417b each have a comb shape in order to apply a sufficiently high electric field to the wide area of the oxide semiconductor layer 411.

In addition, the oxide semiconductor layer 411 described in this embodiment is the highly-purified oxide semiconductor layer; therefore, the transistor 400 can be a transistor which has excellent off-state-current characteristics.

The substrate 101, the source electrode layer 103, the gate insulating layers 410a, 410b, 417a, and 417b, the gate electrode layers 407a, 407b, 415a, and 415b, and the drain electrode layer 113 which are described in this embodiment can be formed using materials which are similar to those of Embodiment 1.

Although an embodiment in which two units in each of which a pair of the gate electrode layers face each other with the oxide semiconductor layer interposed therebetween and a pair of the gate insulating layers face each other with the oxide semiconductor layer interposed therebetween are used is described in this embodiment, there is no particular limitation on the number of pairs of the gate electrode layers which face each other with the oxide semiconductor layer interposed therebetween and the number of pairs of the gate insulating layers which face each other with the oxide semiconductor layer interposed therebetween, and the number of the pairs may be determined as appropriate in accordance with the thickness of the oxide semiconductor layer so that a sufficiently high electric field is applied to the oxide semiconductor layer.

This embodiment can be implemented in appropriate combination with the structure described in any of the other embodiments.

Embodiment 5

In this embodiment, a transistor 500 having a structure in which a conductive layer covered with an oxide semiconductor layer is provided between a pair of gate electrode layers which face each other with the oxide semiconductor layer interposed therebetween and between a pair of gate insulating layers which face each other with the oxide semiconductor layer interposed therebetween will be described with reference to FIGS. 5A and 5B. Further, a transistor having a structure in which a plurality of units in each of which a pair of gate electrode layers face each other with an oxide semiconductor layer interposed therebetween and a pair of gate insulating layers face each other with the oxide semiconductor layer interposed therebetween is provided and a conductive layer covered with the oxide semiconductor layer is provided between the pair of the gate electrode layers and between the pair of the gate insulating layers will be described. As an example, a transistor 600 having a structure in which two units in each of which a pair of gate electrode layers face each other with an oxide semiconductor layer interposed therebetween and a pair of gate insulating layers face each other with the oxide semiconductor layer interposed therebetween are provided and a conductive layer covered with the oxide semiconductor layer is provided between the pair of the gate electrode layers and between the pair of the gate insulating layers will be described with reference to FIGS. 6A to 6B.

Figure 5A:
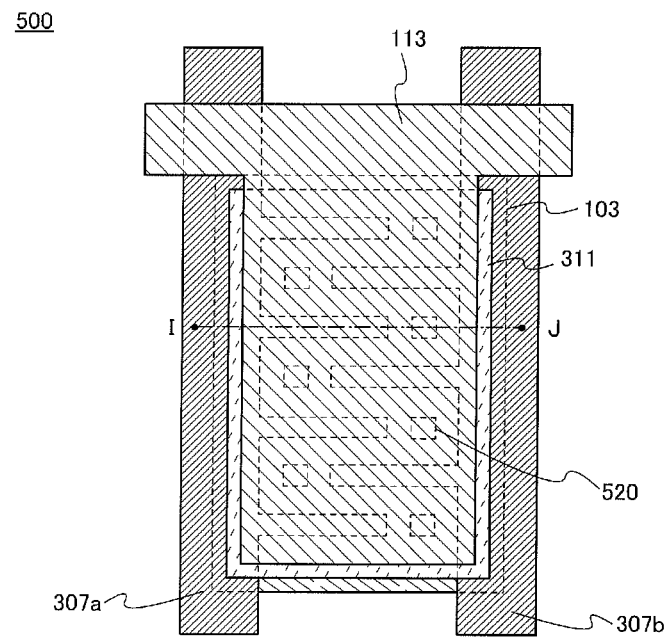
FIG. 5A is a top view of a transistor and FIG. 5B is a cross-sectional view thereof.
Figure 5B:
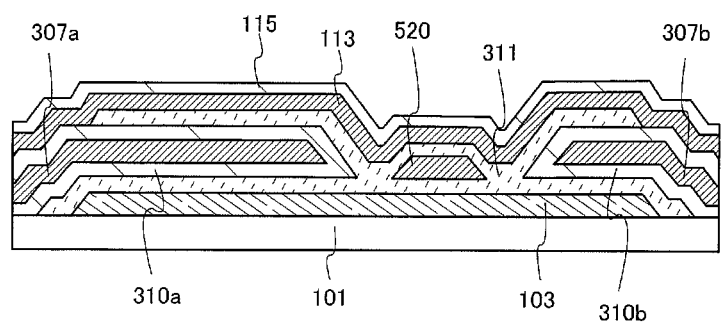

FIG. 5A is a top view of the transistor 500, and FIG. 5B corresponds to a cross-sectional view taken along dashed line I-J in FIG. 5A. Note that when the transistor 500 is described, the portions which are the same as those of the transistor 300 are denoted by common reference numerals which are used in the description of the transistor 300.

As shown in FIG. 5B and FIG. 3B, in the transistor 500, a conductive layer 520 covered with the oxide semiconductor layer 311 is provided between the pair of the gate electrode layers 307a and 307b which face each other with the oxide semiconductor layer 311 interposed therebetween and between the pair of the gate insulating layers 310a and 310b which face each other with the oxide semiconductor layer 311 interposed therebetween in the transistor 300 described in Embodiment 3. The other structures of the transistor 500 are the same as those of the transistor 300.

In the case where the oxide semiconductor layer 311 which is a channel region in the transistor 300 is formed to be thick, the oxide semiconductor layer 311 might be separated by stress. In addition, a distortion (dent) is generated in the thick portion of the oxide semiconductor layer 311 in a stacked structure of the transistor 300, whereby the oxide semiconductor layer 311 might be separated.

Thus, as in this embodiment, the conductive layer 520 covered with the oxide semiconductor layer 311 is formed between the pair of the gate electrode layers 307a and 307b which face each other with the oxide semiconductor layer 311 interposed therebetween and between the pair of the gate insulating layers 310a and 310b which face each other with the oxide semiconductor layer 311 interposed therebetween. Therefore, even in the case where the oxide semiconductor layer 311 which is a channel region is formed to be thick, the stress of the oxide semiconductor layer 311 is relieved, whereby separation of the oxide semiconductor layer 311 can be prevented. Further, the distortion (dent) formed in the thick portion of the oxide semiconductor layer 311 is released, and the stacked structure of the transistor 300 is close to a flat shape. Thus, separation of the oxide semiconductor layer 311 can also be prevented.

The conductive layer 520 can be formed using a material which is similar to that of the source electrode layer 103, the gate electrode layer 107, or the drain electrode layer 113 described in Embodiment 1. Further, the conductive layer 520 is formed at the same time as the pair of the gate electrode layers 307a and 307b which face each other are formed.

Figure 6A:
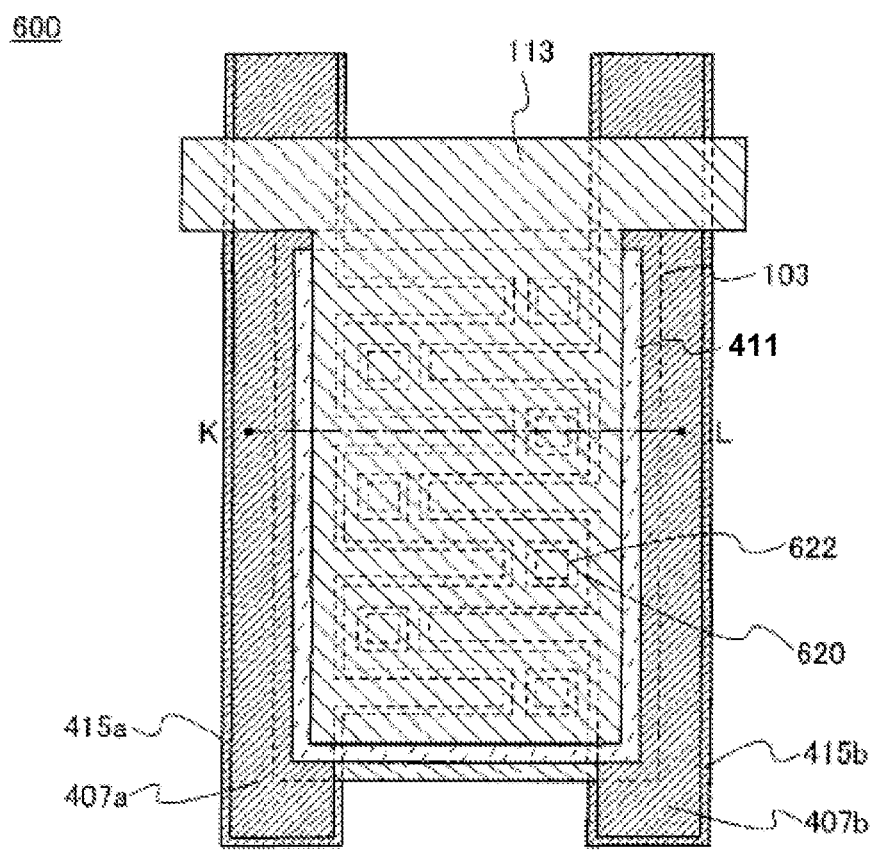
FIG. 6A is a top view of a transistor and FIG. 6B is a cross-sectional view thereof.
Figure 6B:
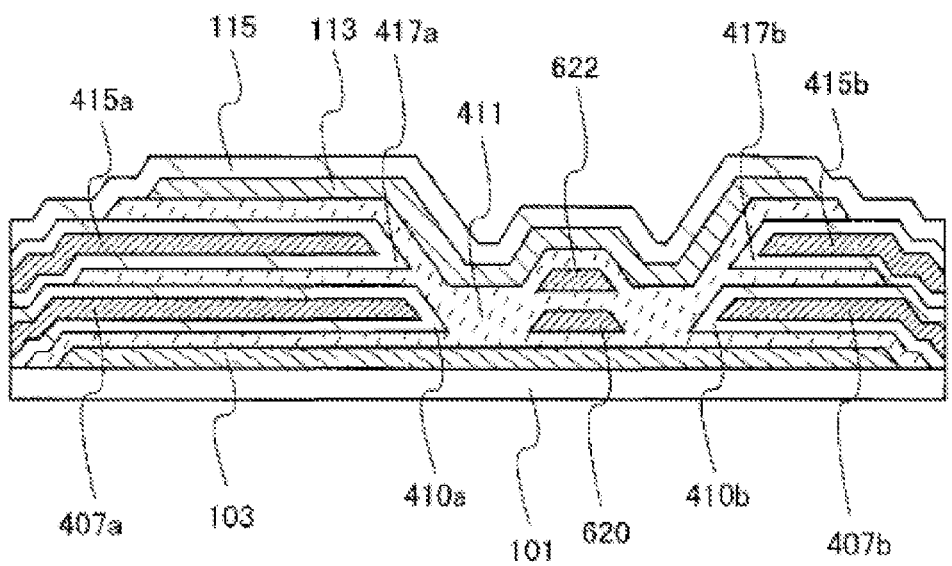

Next, the transistor 600 having a structure in which two units in each of which a pair of gate electrode layers face each other with an oxide semiconductor layer interposed therebetween and a pair of gate insulating layers face each other with the oxide semiconductor layer interposed therebetween are provided and conductive layers which are formed so as to be covered with the oxide semiconductor layer are provided in each of the units in each of which the pair of the gate electrode layers and the pair of the gate insulating layers are provided will be described with reference to FIGS. 6A to 6B.

FIG. 6A is a top view of the transistor 600, and FIG. 6B corresponds to a cross-sectional view taken along dashed line K-L in FIG. 6A. Note that when the transistor 600 is described, the portions which are the same as those of the transistor 400 are denoted by common reference numerals which are used in the description of the transistor 400.

In the case where the oxide semiconductor layer 411 which is a channel region in the transistor 400 is formed to be thick, the oxide semiconductor layer 411 might be separated by stress. In addition, a distortion (dent) is generated in the thick portion of the oxide semiconductor layer 411 in a stacked structure of the transistor 400, whereby the drain electrode layer 411 might be separated.

Thus, as illustrated in FIG. 6B, a conductive layer 620 covered with the oxide semiconductor layer 411 is formed in the unit in which the pair of the gate electrode layers and the pair of the gate insulating layers are provided and a conductive layer 622 covered with the oxide semiconductor layer 411 is formed in the unit in which the pair of the gate electrode layers and the pair of the gate insulating layers are provided. Therefore, even in the case where the oxide semiconductor layer 411 which is a channel region is formed to be thick, the stress of the oxide semiconductor layer 411 is relieved, whereby separation of the oxide semiconductor layer 411 can be prevented. Further, the distortion (dent) formed in the thick portion of the oxide semiconductor layer 411 is released, and the stacked structure of the transistor 400 is close to a flat shape. Thus, separation of the oxide semiconductor layer 411 can also be prevented.

Each of the conductive layer 620 and the conductive layer 622 can be formed using a material which is similar to that of the source electrode layer 103, the gate electrode layer 107, or the drain electrode layer 113 described in Embodiment 1. Further, the conductive layer 620 and the conductive layer 622 are formed at the same time as the pair of the gate electrode layers 407a and 407b facing each other and the pair of the gate electrode layers 415a and 415b facing each other are formed.

In the transistor 500, parts of the gate electrode layers 307a and 307b are covered with the oxide semiconductor layer 311, and a sufficiently high electric field can be applied to the oxide semiconductor layer 311; therefore, a channel region is formed in a wide area of the oxide semiconductor layer 311. Thus, large drain current can flow through the transistor 500.

In the transistor 600, parts of the gate electrode layers 407a, 407b, 415a, and 415b are covered with the oxide semiconductor layer 411, and a sufficiently high electric field can be applied to the oxide semiconductor layer 411; therefore, a channel region is formed in a wide area of the oxide semiconductor layer 411. Thus, large drain current can flow through the transistor 600.

Further, the thickness of the oxide semiconductor layer 311 and the thickness of the oxide semiconductor layer 411 are made large, whereby the transistor 500 and the transistor 600 can have drain-breakdown-voltage characteristics needed for a semiconductor device for high power application. In addition, it is preferable that the gate electrode layers and the gate insulating layers each have a comb shape in order to apply a sufficiently high electric field to the wide areas of the oxide semiconductor layer 311 and the oxide semiconductor layer 411.

This embodiment can be implemented in appropriate combination with the structure described in any of the other embodiments.

Embodiment 6

In this embodiment, a transistor 700 and a transistor 800 will be described with reference to FIGS. 7A and 7B and FIGS. 8A and 8B.

Figure 7A:
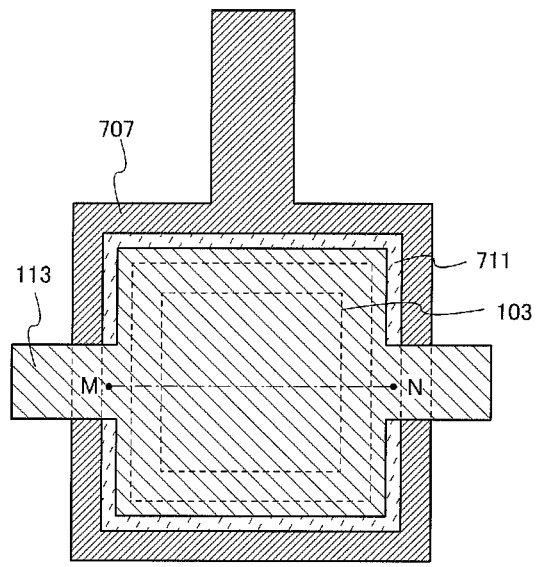
FIG. 7A is a top view of a transistor and FIG. 7B is a cross-sectional view thereof.
Figure 7B:
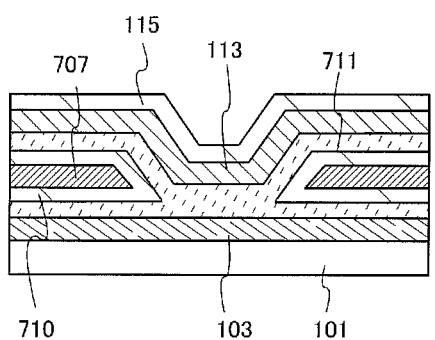
Figure 8A:
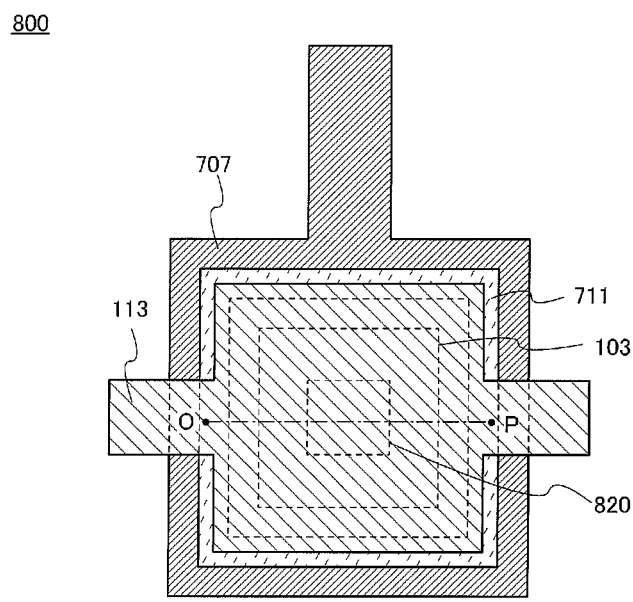
FIG. 8A is a top view of a transistor and FIG. 8B is a cross-sectional view thereof.
Figure 8B:
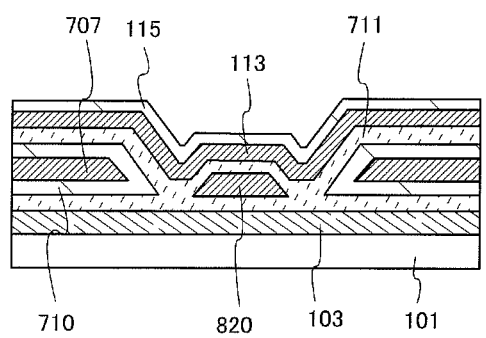

In Embodiments 1 to 5, a preferable shape of each of the gate electrode layers and the gate insulating layers is a comb shape; however, a gate electrode layer may have a circular shape surrounding an oxide semiconductor layer as illustrated in FIGS. 7A and 7B and FIGS. 8A and 8B. Further, in consideration of the influence (such as separation of the thick portion of the oxide semiconductor layer by stress) which is generated in the case where the oxide semiconductor layer is formed to be thick as described in Embodiment 5, a conductive layer covered with an oxide semiconductor layer can be formed inside a gate electrode layer and a gate insulating layer which are formed to have circular shapes as illustrated in FIG. 8B. In other words, the gate electrode layer can have a circular shape in Embodiments 1 to 5.

In addition, a gate electrode layer and a gate insulating layer are not limited to one unit in which a pair of gate electrode layers face each other with an oxide semiconductor layer interposed therebetween and a pair of gate insulating layers face each other with the oxide semiconductor layer interposed therebetween. A plurality of the units may be formed, which is preferable in the case where the oxide semiconductor layer which is a channel region is formed to be thick; accordingly, a sufficiently high electric field can be applied to the thick oxide semiconductor layer.

First, as an example, the transistor 700 will be described in which one gate electrode layer and one gate insulating layer which are formed to have circular shapes are provided and upper surfaces and bottom surfaces of the gate electrode layer and the gate insulating layer are covered with an oxide semiconductor layer.

FIG. 7A is a top view of the transistor 700, and FIG. 7B corresponds to a cross-sectional view taken along dashed line M-N in FIG. 7A.

In other words, in the transistor of FIG. 7B described in this embodiment, the source electrode layer 103 is formed over the substrate 101, and an oxide semiconductor layer 711 is provided in contact with the source electrode layer 103. A gate electrode layer 707 and a gate insulating layer 710 are formed to have circular shapes so as to surround the oxide semiconductor layer 711, and the oxide semiconductor layer 711 is in contact with the gate insulating layer 710 covering the upper surface and bottom surface of the gate electrode layer 707. In addition, the drain electrode layer 113 is provided over the oxide semiconductor layer 711. In the transistor 700, a portion of the gate electrode layer 707 and the gate insulating layer 710, which overlaps with the source electrode layer 103 and the drain electrode layer 113 is embedded in the oxide semiconductor layer 711 in a manner similar to that of the transistors described in Embodiments 1 to 5.

Next, FIG. 8A is a top view of the transistor 800, and FIG. 8B corresponds to a cross-sectional view taken along dashed line O-P in FIG. 8A.

As the transistor 800 of FIGS. 8A and 8B described in this embodiment, a conductive layer 820 is provided inside the gate electrode layer 707 and the gate insulating layer 710 which are formed to have circular shapes so as to surround the oxide semiconductor layer 711 for the transistor 700. In the transistor 800, the effect of providing the conductive layer 820 for the transistor 700 is similar to the effect of providing the conductive layer 520, the conductive layer 620, and the conductive layer 622, which is described in Embodiment 5.

Further, the substrate 101, the source electrode layer 103, the oxide semiconductor layer 711, the gate electrode layer 707, the gate insulating layer 710, and the drain electrode layer 113 in each of the transistor 700 and the transistor 800 can be formed using the materials which are described in Embodiment 1. In addition, the conductive layer 820 in the transistor 800 is formed at the same time as the gate electrode layer 707 is formed; accordingly, the conductive layer 820 is formed using the same material as that of the gate electrode layer 707.

In the transistor 700 and the transistor 800, part of the gate electrode layer 707 is covered with the oxide semiconductor layer 711, and a sufficiently high electric field can be applied to the oxide semiconductor layer 711; therefore, a channel region is formed in a wide area of the oxide semiconductor layer 711. Thus, large drain current can flow through the transistor 700.

Further, the thickness of the oxide semiconductor layer 711 is made large, whereby the transistor 700 and the transistor 800 can have drain-breakdown-voltage characteristics needed for a semiconductor device for high power application.

This embodiment can be implemented in appropriate combination with the structure described in any of the other embodiments.

Embodiment 7

In this embodiment, methods for manufacturing the transistor 100 and the transistor 200 will be described. First, the method for manufacturing the transistor 100 will be described with reference to FIGS. 9A to 9C.

A base insulating layer is formed over the substrate 101. Through this process, impurities in a glass substrate can be prevented from entering the transistors to be formed. Note that for convenience, the base insulating layer is not illustrated in FIGS. 9A to 9C.

The base insulating layer can be formed by a sputtering method, a CVD method, a coating method, or the like.

Note that when the base insulating layer is formed by a sputtering method, the base insulating layer is preferably formed while hydrogen, water, a hydroxyl group, hydride, or the like remaining in a treatment chamber is removed. This is for preventing hydrogen, water, a hydroxyl group, hydride, or the like from being contained in the base insulating layer. It is preferable to use an entrapment vacuum pump in order to remove hydrogen, water, a hydroxyl group, hydride, or the like remaining in the treatment chamber. As an entrapment vacuum pump, for example, a cryopump, an ion pump, or a titanium sublimation pump is preferably used. The evacuation unit may be a turbo pump provided with a cold trap. Hydrogen, water, a hydroxyl group, hydride, or the like is removed from the treatment chamber which is evacuated with a cryopump; thus, when the base insulating layer is formed in the treatment chamber, the concentration of impurities contained in the base insulating layer can be reduced.

As a sputtering gas used for forming the base insulating layer, a high-purity gas is preferably used in which impurities such as hydrogen, water, a hydroxyl group, or hydride are reduced to such a level that the impurity concentration is represented by the unit "ppm" or "ppb".

In this embodiment, a silicon oxide film is formed as the base insulating layer over the substrate 101 in such a manner that the substrate 101 is introduced into the treatment chamber, a sputtering gas containing high-purity oxygen from which hydrogen, water, a hydroxyl group, hydride, or the like is removed is introduced into the treatment chamber, and a silicon target is used. Note that when the base insulating layer is formed, the substrate 101 may be heated.

When the base insulating layer is formed using a stacked structure, for example, a silicon nitride film is formed using a silicon target and a sputtering gas containing high-purity nitrogen, from which hydrogen, water, a hydroxyl group, hydride, or the like is removed, between the silicon oxide film and the substrate. Also in this case, it is preferable that a silicon nitride film be formed while hydrogen, water, a hydroxyl group, hydride, or the like remaining in the treatment chamber is removed in a manner similar to the case of the silicon oxide film. Note that in the process, the substrate 101 may be heated.

In the case where a silicon nitride film and a silicon oxide film are stacked as the base insulating layer, the silicon nitride film and the silicon oxide film can be formed in the same treatment chamber with the use of a common silicon target. First, the silicon nitride film is formed in such a manner that a sputtering gas containing nitrogen is introduced and a silicon target mounted on the treatment chamber is used. Then, the silicon oxide film is formed in such a manner that the gas is switched to a sputtering gas containing oxygen and the same silicon target is used. The silicon nitride film and the silicon oxide film can be formed in succession without being exposed to the air; therefore, impurities such as hydrogen, water, a hydroxyl group, or hydride can be prevented from being attached to the surface of the silicon nitride film.

Then, the source electrode layer 103 is formed over the base insulating layer. First, a conductive film is formed over the substrate 101 by a sputtering method which is a physical vapor deposition method (PVD method), a chemical vapor deposition method (CVD method), or a vacuum evaporation method. A resist mask is formed over the conductive film in a first photolithography step, and first etching is performed on the conductive film using the resist mask, whereby the source electrode layer 103 is formed. Alternatively, the source electrode layer 103 is formed by a printing method or an ink-jet method without using a photolithography step, so that the number of steps can be reduced. Note that the end portions of the source electrode layer 103 preferably have a tapered shape because the coverage with the gate insulating layer formed later can be improved.

In this embodiment, as the conductive film to be the source electrode layer 103, a 50-nm-thick titanium film, a 100-nm-thick aluminum film, and a 50-nm-thick titanium film are stacked in that order by a sputtering method, and the first etching is performed using the resist mask formed in the first photolithography step, whereby the source electrode layer 103 is formed.

Next, a first insulating film 104 to be the gate insulating layer 110 is formed over the source electrode layer 103. The first insulating film 104 to be the gate insulating layer 110 is formed by a sputtering method, whereby concentration of hydrogen in the insulating film 104 can be reduced. In the case of forming a silicon oxide film by a sputtering method, a silicon target or a quartz target is used as a target, and oxygen or a mixed gas of oxygen and argon is used as a sputtering gas. The first insulating film 104 is preferably formed so that concentration of hydrogen is reduced. The first insulating film 104 may be formed using a similar method to a method for forming the base insulating layer. For example, the first insulating film 104 is formed using a sputtering gas containing high-purity oxygen from which hydrogen, water, a hydroxyl group, hydride, or the like is removed, or the first insulating film 104 is formed while hydrogen, water, a hydroxyl group, hydride, or the like remaining in the treatment chamber is removed. Further, preheat treatment is preferably performed before the first insulating film 104 is formed, in order to remove moisture or hydrogen which remains on an inner wall of a sputtering apparatus, on a surface of the target, or inside a target material. After the preheat treatment, the substrate or the sputtering apparatus is cooled. Then, the first insulating film 104 is formed without exposure to the air. Note that in this embodiment, a silicon oxide film with a thickness of 100 nm is formed.

The first insulating film 104 can have a stacked structure. For example, a stacked structure may be used in which a silicon oxide film ($SiO_x$ (x>0)) with a thickness greater than or equal to 5 nm and less than or equal to 300 nm is formed and a silicon nitride film ($SiN_y$ (y>0)) with a thickness greater than or equal to 50 nm and less than or equal to 200 nm is formed over the silicon oxide film by a sputtering method.

Next, the gate electrode layer 107 is formed over the first insulating film 104. The gate electrode layer 107 can be formed in a manner similar to that of the source electrode layer 103. First, a conductive film is formed over the first insulating film 104, a resist mask is formed in a second photolithography step, and second etching is performed on the conductive film using the resist mask, whereby the gate electrode layer 107 can be formed. In this embodiment, after a titanium film with a thickness of 150 nm is formed by a sputtering method, the gate electrode layer 107 is formed by the photolithography step and the etching step. Through the step of forming the gate electrode layer 107, a gate wiring can also be formed at the same time.

Figure 9A:
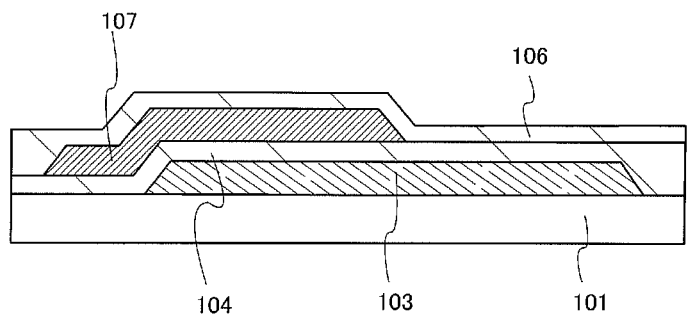
FIGS. 9A to 9C are cross-sectional views illustrating a method for manufacturing the transistor.

A second insulating film 106 to be the gate insulating layer 110 is formed over the first insulating film 104 and the gate electrode layer 107. The second insulating film 106 can be formed in a manner similar to that of the first insulating film 104. In this embodiment, a silicon oxide film with a thickness of 100 nm is formed by a sputtering method. The steps up to here are illustrated in FIG. 9A.

Next, a resist mask is formed in a third photolithography step so as to expose part of the source electrode layer 103, and the first insulating film 104 and the second insulating film 106 are etched using the resist mask, whereby the gate insulating layer 110 is formed.

Next, an island-shaped oxide semiconductor layer to be in contact with the gate insulating layer 110 and part of the source electrode layer 103 is formed. Then, the drain electrode layer 113 which is in contact with the island-shaped oxide semiconductor layer is formed.

First, an oxide semiconductor film is formed by a sputtering method, a coating method, a printing method, or the like over the gate insulating layer 110 and part of the source electrode layer 103. Next, a conductive film to be the drain electrode layer 113 is formed over the oxide semiconductor film. In this embodiment, the oxide semiconductor film is formed by a sputtering method.

As pretreatment, it is preferable that the substrate 101 formed through the steps up to and including the step of FIG. 9A be preheated in a preheating chamber of a sputtering apparatus and impurities such as hydrogen, water, a hydroxyl group, or hydride attached to the substrate 101 be eliminated and removed so that hydrogen is contained in the oxide semiconductor film as little as possible. As an exhaustion unit provided in the preheating chamber, a cryopump is preferable. Note that this preheating treatment can be omitted. This preheating step may be performed on the substrate 101 over which the source electrode layer 103 has been formed but the gate insulating layer 110 has not been formed or may be performed on the substrate 101 over which the drain electrode layer 113 formed in the later step has not been formed.

Note that before the oxide semiconductor film is formed by a sputtering method, reverse sputtering in which plasma is generated by introduction of an argon gas is preferably performed, and the oxide film and particles attached to the surfaces of the gate insulating layer 110 and part of the source electrode layer 103 are removed, so that resistance at the interface between the gate insulating layer 110 and the oxide semiconductor film and between part of the source electrode layer 103 and the oxide semiconductor film can be reduced. The reverse sputtering refers to a method in which, without application of voltage to a target side, a high-frequency power source is used for application of voltage to a substrate side in an argon atmosphere and plasma is generated in the vicinity of the substrate to modify a surface. Note that instead of an argon atmosphere, a nitrogen atmosphere, a helium atmosphere, or the like may be used.

In this embodiment, the oxide semiconductor film is formed by a sputtering method with the use of an oxide semiconductor target. The oxide semiconductor film can be formed by a sputtering method in a rare gas (typically argon) atmosphere, an oxygen atmosphere, or an atmosphere of a rare gas (typically argon) and oxygen. When a sputtering method is employed, a target containing $SiO_2$ at 2 wt % to 10 wt %, inclusive may be used.

As a sputtering gas used for forming the oxide semiconductor film, a high-purity gas is preferably used in which impurities such as hydrogen, water, a hydroxyl group, or hydride are reduced to such a level that the impurity concentration is represented by the unit "ppm" or "ppb".

As an example of an oxide semiconductor target used in this embodiment, an oxide semiconductor target containing In, Ga, and Zn (composition ratio is $In_2O_3:Ga_2O_3:ZnO=1:1:1$ [molar ratio], that is, In:Ga:Zn=1:1:0.5 [molar ratio]) can be used. As the oxide semiconductor target containing In, Ga, and Zn, a target having a composition ratio of In:Ga:Zn=1:1:1 [molar ratio] or In:Ga:Zn=1:1:2 [molar ratio] can also be used. The filling rate of the oxide semiconductor target is higher than or equal to 90% and lower than or equal to 100%, preferably higher than or equal to 95% and lower than or equal to 99.9%. An oxide semiconductor film which is formed using the oxide semiconductor target with high filling rate is dense.

In the case where an In—Zn—O-based material is used as an oxide semiconductor, a target therefore has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The oxide semiconductor film is formed over the source electrode layer 103 and the gate insulating layer 110 in such a manner that a sputtering gas from which hydrogen, water, a hydroxyl group, hydride, or the like is removed is introduced into the treatment chamber and a metal oxide is used as a target while the substrate is held in the treatment chamber held in a reduced-pressure state and moisture remaining in the treatment chamber is removed. It is preferable to use an entrapment vacuum pump in order to remove hydrogen, water, a hydroxyl group, hydride, or the like remaining in the treatment chamber. For example, a cryopump, an ion pump, or a titanium sublimation pump is preferably used. The evacuation unit may be a turbo pump provided with a cold trap. For example, hydrogen, water, a hydroxy group, hydride, or the like (more preferably, including a compound containing a carbon atom) is exhausted from the treatment chamber with the use of a cryopump. Therefore, the concentration of impurities contained in the oxide semiconductor film formed in this chamber can be reduced. The oxide semiconductor film may be formed while the substrate is heated.

In this embodiment, as an example of the film formation condition, the following conditions are applied: the distance between the substrate 101 and the target is 170 mm; the substrate temperature is 250° C.; the pressure is 0.4 Pa; the direct current (DC) power is 0.5 kW; and the atmosphere contains oxygen, the atmosphere contains argon, or the atmosphere contains oxygen and argon. Note that a pulsed direct-current (DC) power source is preferably used, in which case dust can be reduced and the thickness can be uniform. The thickness of the oxide semiconductor film is preferably greater than or equal to 50 nm and less than or equal to 500 nm. The thickness of the oxide semiconductor film is 100 nm in this embodiment. Note that the appropriate thickness of the oxide semiconductor film differs depending on the oxide semiconductor material to be used for the oxide semiconductor layer 111; therefore, the thickness may be determined as appropriate in accordance with the oxide semiconductor material.

The conductive film to be the drain electrode layer 113 can be formed in a manner similar to that of the source electrode layer 103. In this embodiment, as the conductive film to be the drain electrode layer 113, a 50-nm-thick titanium film, a 100-nm-thick aluminum film, and a 50-nm-thick titanium film are stacked in that order.

Next, a resist mask is formed over the conductive film in a fourth photolithography step, the conductive film to be the drain electrode layer 113 and the oxide semiconductor film to be the island-shaped oxide semiconductor layer are etched using the resist mask, whereby the drain electrode layer 113 and the island-shaped oxide semiconductor layer are formed. By forming a resist mask using an inkjet method instead of the resist mask formed in the fourth photolithography step, the number of steps can be reduced. Note that the etching of the conductive film and the oxide semiconductor film here may be performed using either dry etching or wet etching, or using both dry etching and wet etching. The etching conditions (such as an etchant, etching time, and temperature) are adjusted as appropriate in accordance with the material in order to form the drain electrode layer 113 and the island-shaped oxide semiconductor layer with desired shapes. For example, the conductive film may be processed into the drain electrode layer 113 by wet etching; then, the oxide semiconductor film may be processed into the island-shaped oxide semiconductor layer by dry etching using the drain electrode layer 113 as a mask.

As an etchant used for wet etching of the oxide semiconductor film, a mixed solution of phosphoric acid, acetic acid, and nitric acid, an ammonia hydrogen peroxide mixture (hydrogen peroxide water at 31 wt %: ammonia water at 28 wt %: water=5:2:2 (volume ratio)), or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium contained in the oxide semiconductor film is collected from the waste liquid after the etching and reused, the resources can be efficiently used and the cost can be reduced.

As an etching gas used for dry etching of the oxide semiconductor film, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate reactive ion etching (RIE) method or an inductively coupled plasma (ICP) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) is adjusted as appropriate.

Figure 9B:
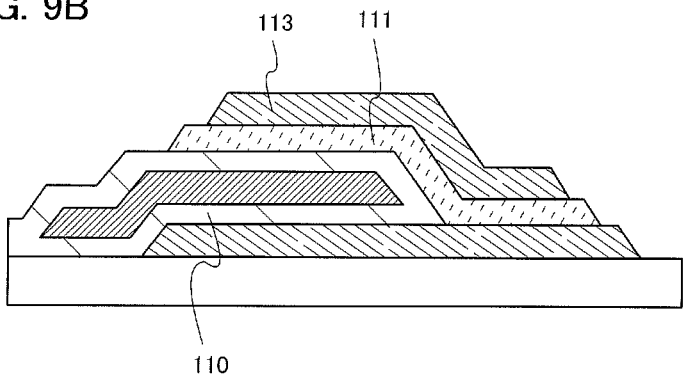

The steps up to here are illustrated in FIG. 9B.

Next, the island-shaped oxide semiconductor layer is subjected to heat treatment. The temperature of the heat treatment is higher than or equal to 400° C. and lower than or equal to 750° C., preferably higher than or equal to 400° C. and lower than the strain point of the substrate. Here, the substrate is introduced into an electric furnace that is a kind of heat treatment apparatus and heat treatment is performed on the island-shaped oxide semiconductor layer at 450° C. in an atmosphere of an inert gas such as nitrogen or a rare gas for one hour. Then, the oxide semiconductor layer is not exposed to air; accordingly, hydrogen, water, a hydroxyl group, hydride, or the like can be prevented from entering the island-shaped oxide semiconductor layer. As a result, the highly-purified oxide semiconductor layer 111 whose concentration of hydrogen is reduced can be obtained. That is, at least one of dehydration and dehydrogenation of the island-shaped oxide semiconductor layer can be performed by the heat treatment.

Note that it is preferable that in the heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into a heat treatment apparatus is preferably 6N (99.9999%) or higher, more preferably 7N (99.99999%) or higher (that is, the concentration of the impurities is 1 ppm or lower, preferably 0.1 ppm or lower).

In addition, the heat treatment performed on the island-shaped oxide semiconductor layer may be performed before the fourth photolithography step which is performed on the oxide semiconductor film and the conductive layer to be the drain electrode layer 113. In that case, after the heat treatment, the substrate is taken out of the heat treatment apparatus and the fourth photolithography step is performed. Alternatively, the heat treatment may be performed before the conductive film to be the drain electrode layer 113 is formed over the oxide semiconductor film.

Next, the protective insulating layer 115 is formed. The protective insulating layer 115 is formed using an oxide insulating film such as a silicon oxide film, a silicon oxynitride film, an aluminum oxide film, or an aluminum oxynitride film; or a nitride insulating film such as a silicon nitride film, a silicon nitride oxide film, an aluminum nitride film, or an aluminum nitride oxide film. Alternatively, an oxide insulating film and a nitride insulating film can be stacked. The protective insulating layer 115 can be formed in a manner similar to the first insulating film 104 and the second insulating film 106.

Figure 9C:
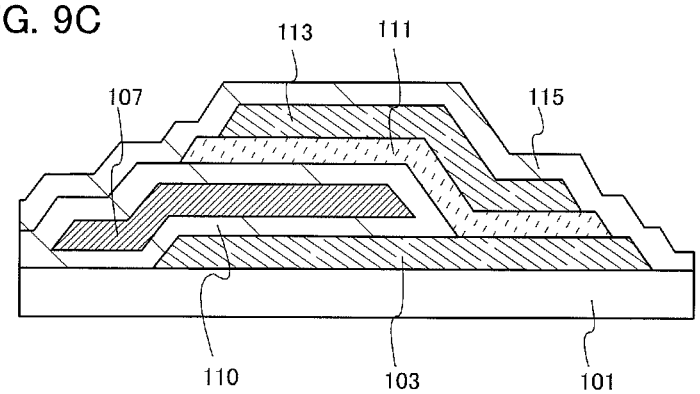

After the protective insulating layer 115 is formed, heat treatment may be further performed at higher than or equal to 100° C. and lower than or equal to 200° C. in air for longer than or equal to 1 hour and shorter than or equal to 30 hours. In that case, the heat treatment can be referred to as second heat treatment, and the heat treatment in which at least one of dehydration and dehydrogenation is performed can be referred to as first heat treatment. Reliability of the transistor 100 can be improved by the second heat treatment. The steps up to here are illustrated in FIG. 9C.

Through the above process, the transistor 100 including the oxide semiconductor layer 111 which is highly purified and whose concentration of hydrogen is reduced can be formed. Therefore, by the manufacturing method described in this embodiment, the transistor 100 in which large drain current can flow and which has high drain-breakdown-voltage characteristics as described in Embodiment 1 can be formed.

Figure 10A:
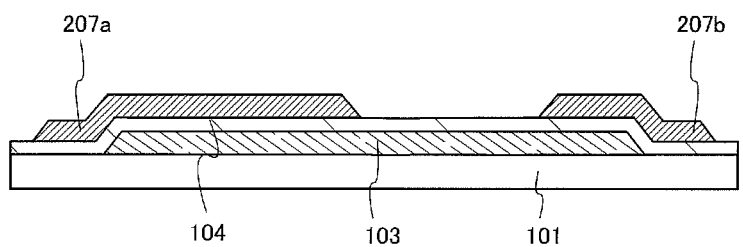
FIGS. 10A and 10B are cross-sectional views illustrating a method for manufacturing the transistor.

Here, the method for manufacturing the transistor 200 will be described with reference to FIGS. 10A and 10B. As the transistor 200, a photolithography step is performed and a resist mask is formed in such a way that conductive films serving as the gate electrode layers 207a and 207b face each other when the gate electrode layer 107 is formed in the method for manufacturing the transistor 100. The conductive film is etched using the resist mask, whereby the gate electrode layers 207a and 207b which face each other can be formed (see FIG. 10A).

Figure 10B:
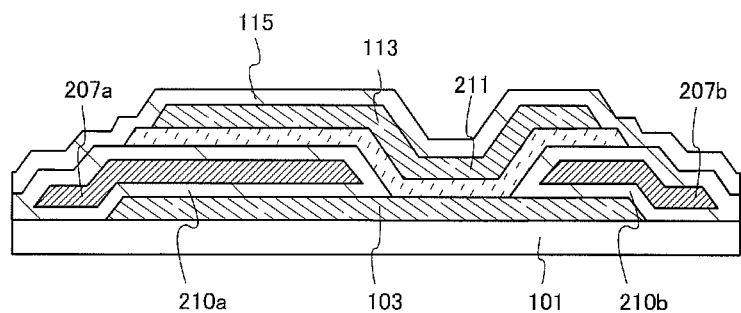

Then, the steps described in this embodiment are performed as appropriate, whereby the transistor 200 described in Embodiment 2 can be formed (see FIG. 10B).

This embodiment can be implemented in appropriate combination with the structure described in any of the other embodiments.

Embodiment 8

In this embodiment, methods for manufacturing the transistor 300, the transistor 400, and the transistor 700 will be described. First, the transistor 300 will be described with reference to FIGS. 11A to 11D.

A substrate which is similar to that in Embodiment 7 can be used as the substrate 101. Then, the base insulating layer and the source electrode layer 103 are formed in a manner similar to those of Embodiment 7.

Figure 11A:
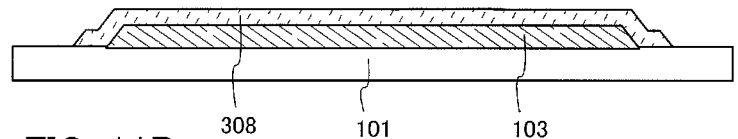
FIGS. 11A to 11D are cross-sectional views illustrating a method for manufacturing the transistor.
Figure 11B:
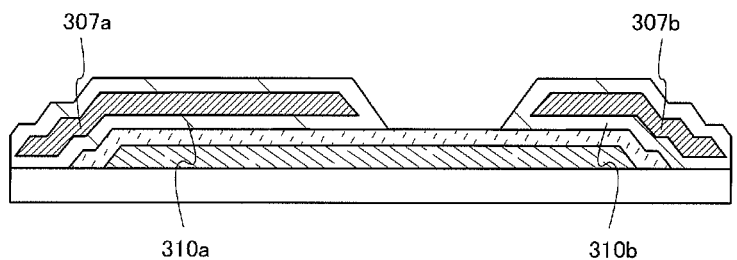
Figure 11C:
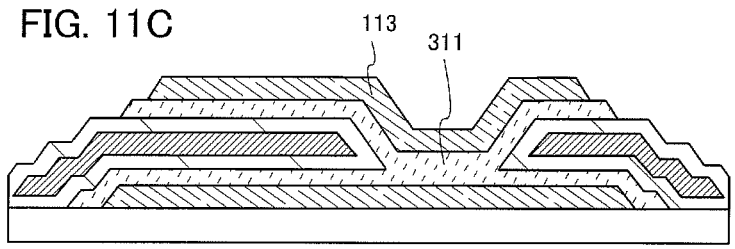

Next, an oxide semiconductor layer 308 is formed over the source electrode layer 103 (see FIG. 11A).

A first oxide semiconductor film to be the oxide semiconductor layer 308 can be formed in a manner similar to that in Embodiment 7. Here, an In—Ga—Zn—O-based oxide semiconductor film with a thickness of 100 nm is formed over the source electrode layer 103. Then, a photolithography step is performed, and the first oxide semiconductor film is etched, whereby the oxide semiconductor layer 308 is formed. The photolithography step and the etching step may be performed in a manner similar to those of Embodiment 7.

Next, the gate electrode layers 307a and 307b which face each other and which are covered with the gate insulating layers 310a and 310b are formed over the oxide semiconductor layer 308. The gate electrode layers 307a and 307b which face each other and the gate insulating layers 310a and 310b can be formed by the method described in Embodiment 7 (see FIG. 11B).

Next, a second oxide semiconductor film is formed over the gate insulating layers 310a and 310b and part of the oxide semiconductor layer 308. The second oxide semiconductor film is formed in a manner similar to that of the first oxide semiconductor film. In this embodiment, an In—Ga—Zn—O-based oxide semiconductor film is formed to 100 nm. Further, a conductive film to be the drain electrode layer 113 is formed over the second oxide semiconductor film in a manner similar to that in Embodiment 7. Here, a 50-nm-thick titanium film, a 100-nm-thick aluminum film, and a 50-nm-thick titanium film are stacked in that order.

A photolithography step and an etching step are performed. Then, heat treatment in which at least one of dehydration and dehydrogenation is performed is carried out, whereby the oxide semiconductor layer 311 and the drain electrode layer 113 are formed (see FIG. 11C). The photolithography step and the etching step here can be performed by the method described in Embodiment 7. With this step, a structure includes a pair of the gate electrode layers 307a and 307b which face each other with the oxide semiconductor layer 311 interposed therebetween and a pair of the gate insulating layers 310a and 310b which face each other with the oxide semiconductor layer 311 interposed therebetween, which is the feature of the transistor 300 described in Embodiment 3. The heat treatment can be performed by a method which is similar to that in Embodiment 7, and the heat treatment can also be performed at the timing which is the same as the timing described in Embodiment 7.

Figure 11D:
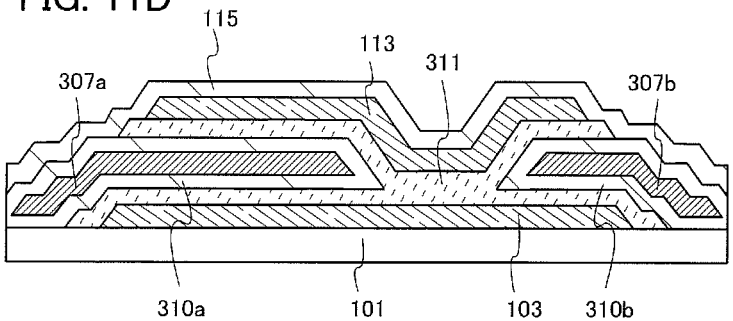
Figure 12A:
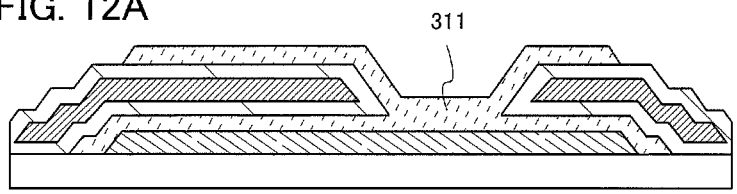
FIGS. 12A to 12D are cross-sectional views illustrating a method for manufacturing the transistor.
Figure 12B:
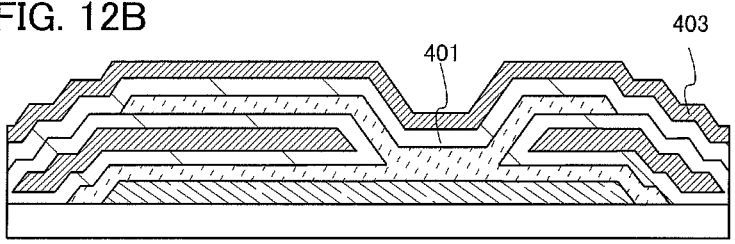
Figure 12C:
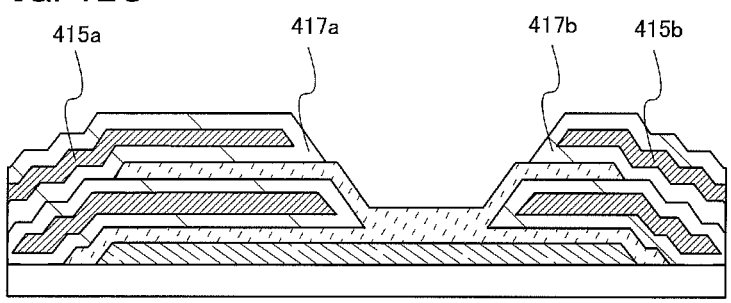
Figure 12D:
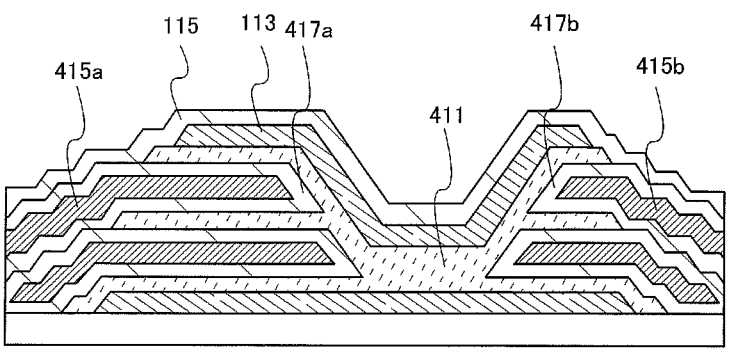

Next, the protective insulating layer 115 is formed in a manner similar to that in Embodiment 7, and further the second heat treatment described in Embodiment 7 is performed as appropriate, whereby the transistor 300 described in Embodiment 3 can be formed (see FIG. 11D).

Here, a method for manufacturing the transistor 400 described in Embodiment 4 will be described with reference to FIGS. 12A to 12D. After the oxide semiconductor layer 311 described in this embodiment is formed (see FIG. 12A), an insulating film 401 and a conductive film 403 which is to serve as the gate electrode layers 415a and 415b later are formed over the oxide semiconductor layer 311 (see FIG. 12B). Then, the gate electrode layers 415a and 415b are formed by performing a photolithography step and an etching step. After that, an insulating film is formed so as to cover the gate insulating layers 417a and 417b, and a photolithography step and an etching step are performed, whereby the gate insulating layers 417a and 417b can be formed (see FIG. 12C). Note that for the detailed description of the gate electrode layers 415a and 415b and the gate insulating layers 417a and 417b, refer to the description in Embodiment 7, as appropriate.

Next, a third oxide semiconductor film is further formed over the oxide semiconductor layer 311, and a photolithography step and an etching step are performed, whereby the oxide semiconductor layer 411 is formed. The third oxide semiconductor film may be formed in a manner similar to that of the first oxide semiconductor film and the second oxide semiconductor film. Note that the oxide semiconductor layer 411 is subjected to heat treatment in which at least one of dehydration and dehydrogenation is performed (the first heat treatment described in Embodiment 7), as appropriate.

Over the oxide semiconductor layer 411, the drain electrode layer 113 and the protective insulating layer 115 are formed by the method described in Embodiment 7, and the second heat treatment described in Embodiment 7 is performed, as appropriate. Accordingly, the transistor 400 having two units in each of which a pair of the gate electrode layers face each other with an oxide semiconductor layer interposed therebetween and a pair of the gate insulating layers face each other with the oxide semiconductor layer interposed therebetween, which is described in Embodiment 4, can be formed (see FIG. 12D).

Here, a method for manufacturing the transistor 700 will be described. In the manufacturing steps of the transistor 300, a photolithography step and an etching step are performed in such a way that a conductive film serving as the gate electrode layers 307a and 307b are formed to have circular shapes (see FIGS. 7A and 7B). Then, the method for manufacturing the transistor 300 described in this embodiment is used as appropriate, whereby the transistor 700 can be formed in such a way that the gate electrode layer 707 and the gate insulating layer 710 which are covered with the oxide semiconductor layer 711 described in Embodiment 6 have circular shapes so as to surround the oxide semiconductor layer 711.

This embodiment can be implemented in appropriate combination with the structure described in any of the other embodiments.

Embodiment 9

In this embodiment, a method for manufacturing the transistor 500 will be described with reference to FIGS. 13A to 13E.

A substrate which is similar to that in Embodiment 7 can be used as the substrate 101. Then, the base insulating layer and the source electrode layer 103 are formed in a manner similar to that in Embodiment 7.

Figure 13A:
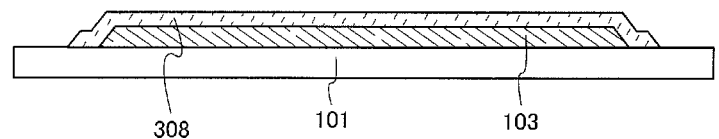
FIGS. 13A to 13E are cross-sectional views illustrating a method for manufacturing the transistor.
Figure 13B:
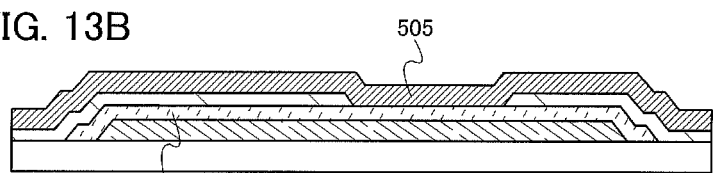

Next, the oxide semiconductor layer 308 is formed over the source electrode layer 103 by a method which is similar to that described in Embodiment 7 (see FIG. 13A), and a first insulating film is formed over the oxide semiconductor layer 308. A photolithography step and an etching step are performed on the first insulating film so as to expose part of the oxide semiconductor layer 308. As illustrated in FIG. 13B, over the island-shaped first insulating film and the oxide semiconductor layer 308 which is partly exposed, a conductive film 505 which is to serve as the gate electrode layers 307a and 307b and the conductive layer 520 later is formed.

Figure 13C:
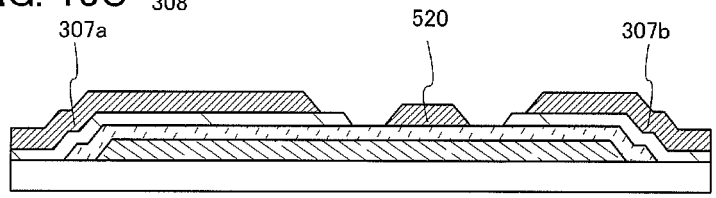

As illustrated in FIG. 13C, a photolithography step and an etching step are performed on the conductive film 505, whereby the gate electrode layers 307a and 307b and the conductive layer 520 are formed.

Figure 13D:
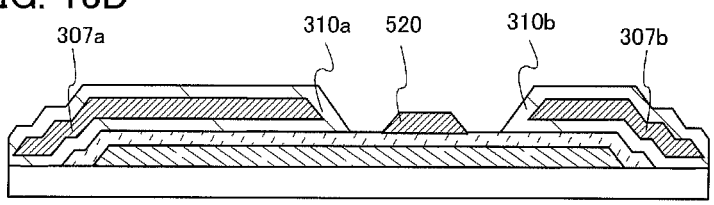

Next, a second insulating film in contact with the gate electrode layers 307a and 307b and the conductive layer 520 is formed, and a photolithography step and an etching step are performed, whereby the gate insulating layers 310a and 310b are formed so as to cover the gate electrode layers 307a and 307b (see FIG. 13D). Note that although the photolithography step and the etching step can be performed using the method described in Embodiment 7, it is necessary to etch the conductive layer 520 as appropriate so as not to be covered with the second insulating film.

Next, a second oxide semiconductor film and a conductive film to be the drain electrode layer 113 are formed over the gate insulating layers 310a and 310b, the conductive layer 520, and part of the oxide semiconductor layer 308. The second oxide semiconductor film can be formed in a manner similar to that in Embodiment 8. In this embodiment, an In—Ga—Zn—O-based oxide semiconductor film is formed to 100 nm. Further, the conductive film to be the drain electrode layer 113 can also be formed in a manner similar to that in Embodiment 8. Here, a 50-nm-thick titanium film, a 100-nm-thick aluminum film, and a 50-nm-thick titanium film are stacked in that order.

After a photolithography step and an etching step are performed on the second oxide semiconductor film and the conductive film to be the drain electrode layer 113, the first heat treatment described in Embodiment 7 is performed, whereby the oxide semiconductor layer 311 and the drain electrode layer 113 are formed. With the steps up to here, a structure having the conductive layer which is formed so as to be covered with the oxide semiconductor layer can be formed between a pair of the gate electrode layers which face each other with the oxide semiconductor layer interposed therebetween and between a pair of the gate insulating layers which face each other with the oxide semiconductor layer interposed therebetween. Note that the photolithography step and the etching step can be performed in a manner similar to those of Embodiment 7.

Figure 13E:
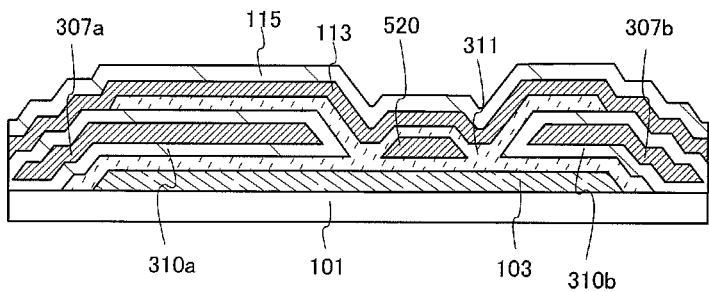

The protective insulating layer 115 is formed and the second heat treatment described in Embodiment 7 is performed, whereby the transistor 500 can be formed (see FIG. 13E).

Here, a method for manufacturing the transistor 600 will be described. The transistor 600 can be formed by appropriately using the method for manufacturing the transistor 400 and the method for manufacturing the transistor 500.

The method for manufacturing the transistor 600 is the same as the method for manufacturing the transistor 500 before the step of forming the conductive film to be the drain electrode layer 113 of the transistor 500. With the steps up to here, the gate electrode layers 407a and 407b, the gate insulating layers 410a and 410b, and the conductive layer 620 can be formed.

The gate electrode layers 415a and 415b, the gate insulating layers 417a and 417b, and the conductive layer 622 of the transistor 600 may be formed appropriately using the method for manufacturing the gate electrode layers 307a and 307b, the gate insulating layers 310a and 310b, and the conductive layer 520 of the transistor 500 before the step of forming the conductive film to be the drain electrode layer 113 in the method for manufacturing the transistor 500. For the structure obtained through the steps up to here, the third oxide semiconductor film described in the method for manufacturing the transistor 400 is formed, and the first heat treatment described in Embodiment 7 is performed, whereby the oxide semiconductor layer 411 is formed.

Then, the protective insulating layer 115 is formed, and the second heat treatment described in Embodiment 7 is performed, whereby the transistor 600 can be formed.

The transistor 800 illustrated in FIGS. 8A and 8B can be formed in such a way that the conductive film serving as the gate electrode layers 307a and 307b formed by the method for manufacturing the transistor 500 is processed into the circular gate electrode layer 707, the circular gate insulating layer 710, and the conductive layer 820 covered with the oxide semiconductor layer. Note that the other manufacturing steps of the transistor 800 except this step are similar to those of the transistor 500.

This embodiment can be implemented in appropriate combination with the structure described in any of the other embodiments.

With this embodiment, large drain current can flow through the transistor which is one embodiment of the present invention and which has high drain-breakdown-voltage characteristics; therefore, the transistor which is one embodiment of the present invention is preferable for a semiconductor device for high power application.

Embodiment 10

An embodiment which uses a circuit including the transistor described in any of the above embodiments will be described.

The transistor described in any of the above embodiments has a high on-off ratio and high breakdown voltage and is scarcely degraded. Thus, the transistor can be used in the following examples: a DC-DC converter circuit; a motor control circuit; an audio amplifier; a logic circuit; a switch circuit; and a high-frequency linear amplifier used for a home electrical appliance to which an inverter technique is applied, such as an air conditioner, a refrigerator, a rice cooker, or a solar photovoltaic system; a battery-driven portable information terminal device, such as a laptop personal computer (PC); a power amplifier device such as a stroboscope; an electric vehicle; and the like.

Here, all example of a solar photovoltaic system including an inverter formed using the transistor described in any of the above embodiments will be described with reference to FIG. 14. Note that an example of a structure of a solar photovoltaic system installed on a house and the like is shown here.

Figure 14:
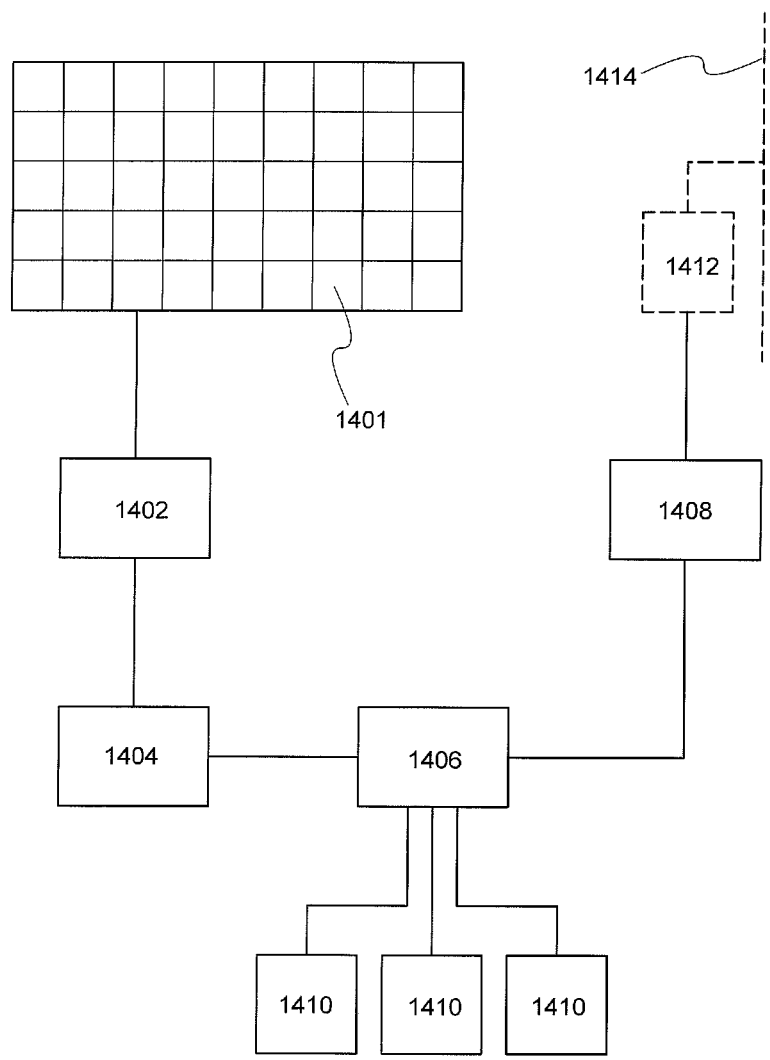
FIG. 14 is a diagram of an example of a solar photovoltaic system.

A residential solar photovoltaic system illustrated in FIG. 14 is a system in which a method for supplying electric power is changed in accordance with a state of solar power generation. When solar power generation is performed, for example, when the sun shines, electric power generated by solar power generation is consumed inside the house, and surplus electric power is supplied to an electric grid 1414 that is led from an electric power company. On the other hand, at night time or at the time of rain when electric power is insufficient, electric power is supplied from the electric grid 1414 and is consumed inside the house.

The residential solar photovoltaic system illustrated in FIG. 14 includes a solar cell panel 1401 which converts sunlight into electric power (direct current power), an inverter 1404 which converts the electric power from direct current into alternating current, and the like. Alternating current power output from the inverter 1404 is used as electric power for operating various types of electric devices 1410.

Surplus electric power is supplied to outside the house through the electric grid 1414. In other words, electric power can be sold using this system. A DC switch 1402 is provided to select connection or disconnection between the solar cell panel 1401 and the inverter 1404. An AC switch 1408 is provided to select connection or disconnection between a distribution board 1406 and a transformer 1412 connected to the electric grid 1414.

When the transistor of the disclosed invention is applied to the above inverter, a highly reliable and inexpensive solar photovoltaic system can be realized.

The structures, methods, and the like described in this embodiment can be combined with any of the other embodiments, as appropriate.

This application is based on Japanese Patent Application serial no. 2010-073106 filed with the Japan Patent Office on Mar. 26, 2010, the entire contents of which are hereby incorporated by reference.

The invention claimed is:

1. A transistor comprising:
a source electrode layer;
an oxide semiconductor layer in contact with the source electrode layer;
a drain electrode layer in contact with the oxide semiconductor layer;
a first gate electrode layer,
wherein part of the first gate electrode layer overlaps with the source electrode layer, the drain electrode layer, and the oxide semiconductor layer;
a second gate electrode layer,
wherein part of the second gate electrode layer overlaps with the source electrode layer, the drain electrode layer, and the oxide semiconductor layer;
a first gate insulating layer in contact with a surface of the first gate electrode layer; and
a second gate insulating layer in contact with a surface of the second gate electrode layer,
wherein the first gate insulating layer on a bottom surface side of the first gate electrode layer is in contact with the source electrode layer,
wherein the second gate insulating layer on a bottom surface side of the second gate electrode layer is in contact with the source electrode layer,
wherein the first gate insulating layer on an upper surface side of the first gate electrode layer is in contact with the oxide semiconductor layer, and
wherein the second gate insulating layer on an upper surface side of the second gate electrode layer is in contact with the oxide semiconductor layer,
wherein the first gate electrode layer has a first comb-shaped electrode and the second gate electrode layer has a second comb-shaped electrode,
wherein first side surfaces of the first comb-shaped electrode and second side surfaces of the second comb-shaped electrode have tapered shapes,
wherein one of the first side surfaces and one of the second side surfaces are opposed to each other, and
wherein the oxide semiconductor layer and a part of the drain electrode layer is interposed between the one of the first side surfaces of the first comb-shaped electrode and the one of the second side surfaces of the second comb-shaped electrode.

2. The transistor according to claim 1, wherein the first gate electrode layer and the second gate electrode layer are a pair of gate electrode layers which face each other with the oxide semiconductor layer interposed therebetween, and the first gate insulating layer and the second gate insulating layer are a pair of gate insulating layers which face each other with the oxide semiconductor layer interposed therebetween.

3. A transistor comprising:
a source electrode layer;
an oxide semiconductor layer comprising indium, gallium and zinc in contact with the source electrode layer;
a drain electrode layer in contact with the oxide semiconductor layer;
a first gate electrode layer,
wherein part of the first gate electrode layer overlaps with the source electrode layer, the drain electrode layer, and the oxide semiconductor layer;
a second gate electrode layer,
wherein part of the second gate electrode layer overlaps with the source electrode layer, the drain electrode layer, and the oxide semiconductor layer;
a first gate insulating layer in contact with a surface of the first gate electrode layer; and
a second gate insulating layer in contact with a surface of the second gate electrode layer,
wherein the first gate insulating layer on a bottom surface side of the first gate electrode layer is in contact with the source electrode layer,
wherein the second gate insulating layer on a bottom surface side of the second gate electrode layer is in contact with the source electrode layer,
wherein the first gate insulating layer on an upper surface side of the first gate electrode layer is in contact with the oxide semiconductor layer, and wherein the second gate insulating layer on an upper surface side of the second gate electrode layer is in contact with the oxide semiconductor layer, wherein the first gate electrode layer has a first comb-shaped electrode and the second gate electrode layer has a second comb-shaped electrode, wherein first side surfaces of the first comb-shaped electrode and second side surfaces of the second comb-shaped electrode have tapered shapes, wherein one of the first side surfaces and one of the second side surfaces are opposed to each other, and wherein the oxide semiconductor layer and a part of the drain electrode layer is interposed between the one of the first side surfaces of the first comb-shaped electrode and the one of the second side surfaces of the second comb-shaped electrode.

4. The transistor according to claim 1, wherein the source electrode layer or the drain electrode layer comprises a single layer or a stacked layer each comprising a metal material selected from the group consisting of molybdenum, titanium, chromium, tantalum, tungsten, aluminum, copper, neodymium, scandium and nickel, or an alloy material which includes any materials selected from the group consisting of molybdenum, titanium, chromium, tantalum, tungsten, aluminum, copper, neodymium, scandium and nickel.

5. The transistor according to claim 3, wherein the source electrode layer or the drain electrode layer comprises a single layer or a stacked layer each comprising a metal material selected from the group consisting of molybdenum, titanium, chromium, tantalum, tungsten, aluminum, copper, neodymium, scandium and nickel, or an alloy material which includes any materials selected from the group consisting of molybdenum, titanium, chromium, tantalum, tungsten, aluminum, copper, neodymium, scandium and nickel.

6. The transistor according to claim 1, wherein the source electrode layer or the drain electrode layer comprises a single layer or a stacked layer each comprising a material selected from the group consisting of indium tin oxide, indium oxide containing tungsten oxide, indium zinc oxide containing tungsten oxide, indium oxide containing titanium oxide, indium tin oxide containing titanium oxide, indium zinc oxide and indium tin oxide.

7. The transistor according to claim 3, wherein the source electrode layer or the drain electrode layer comprises a single layer or a stacked layer each comprising a material selected from the group consisting of indium tin oxide, indium oxide containing tungsten oxide, indium zinc oxide containing tungsten oxide, indium oxide containing titanium oxide, indium tin oxide containing titanium oxide, indium zinc oxide and indium tin oxide.

8. The transistor according to claim 1, wherein a thickness of the oxide semiconductor layer is greater than or equal to 30 nm and less than or equal to 1 μm.

9. The transistor according to claim 3, wherein a thickness of the oxide semiconductor layer is greater than or equal to 30 nm and less than or equal to 1 μm.

10. The transistor according to claim 1, wherein a concentration of hydrogen in the oxide semiconductor layer is lower than or equal to $5 \times 10^{19}$ atoms/cm3.

11. The transistor according to claim 3, wherein a concentration of hydrogen in the oxide semiconductor layer is lower than or equal to $5 \times 10^{19}$ atoms/cm3.

12. The transistor according to claim 1, wherein the first gate insulating layer or the second gate insulating layer comprises a single layer or a stacked layer each comprising a material selected from the group consisting of silicon oxide, silicon nitride, silicon oxynitride, silicon nitride oxide, aluminum oxide, aluminum nitride, aluminum oxynitride, aluminum nitride oxide, tantalum oxide and gallium oxide.

13. The transistor according to claim 3, wherein the first gate insulating layer or the second gate insulating layer comprises a single layer or a stacked layer each comprising a material selected from the group consisting of a silicon oxide film, a silicon nitride film, a silicon oxynitride film, a silicon nitride oxide film, an aluminum oxide film, an aluminum nitride film, an aluminum oxynitride film, an aluminum nitride oxide film, a tantalum oxide film and a gallium oxide film.

* * * * *

UNITED STATES PATENT AND TRADEMARK OFFICE
CERTIFICATE OF CORRECTION

PATENT NO. : 9,040,980 B2  
APPLICATION NO. : 13/046931  
DATED : May 26, 2015  
INVENTOR(S) : Endo Page 1 of 1

It is certified that error appears in the above-identified patent and that said Letters Patent is hereby corrected as shown below:

In the specification

Column 6, line 45, after "layer" replace "III" with --111--;

Column 8, line 23, replace "2076" with --207b--;

Column 8, line 44, replace "2076" with --207b--;

Column 8, line 49, replace "highly purified" with --highly-purified--;

Column 8, line 53, replace "2106" with --210b--;

Column 9, line 12, replace "3106" with --310b--;

Column 9, line 26, replace "3076" with --307b--;

Column 9, line 56, replace "3106" with --310b--;

Column 9, line 57, replace "3076" with --307b--;

Column 13, line 49, replace "4156" with --415b--;

Column 21, line 61, replace "3076" with --307b--;

Column 22, line 2, replace "3106" with --310b--;

Column 22, line 44, replace "4176" with --417b--;

Column 23, line 47, replace "3076" with --307b--;

Column 23, line 51, replace "3076" with --307b--;

Column 24, line 29, replace "4176" with --417b--; and

Column 25, line 13, replace "all" with --an--.

Signed and Sealed this  
Ninth Day of February, 2016

Michelle K. Lee  
*Director of the United States Patent and Trademark Office*